(12) United States Patent
Kimata

(10) Patent No.: US 8,050,722 B2
(45) Date of Patent: Nov. 1, 2011

(54) VOLTAGE SUPPLY CONTROL DEVICE AND VOLTAGE SUPPLY CONTROL METHOD

(75) Inventor: Yusuke Kimata, Tokyo (JP)

(73) Assignee: NEC Corporation, Tokyo (JP)

( * ) Notice: Subject to any disclaimer, the term of this patent is extended or adjusted under 35 U.S.C. 154(b) by 1278 days.

(21) Appl. No.: 11/292,121

(22) Filed: Dec. 2, 2005

(65) Prior Publication Data
US 2006/0128445 A1    Jun. 15, 2006

(30) Foreign Application Priority Data
Dec. 10, 2004   (JP) .................................. 2004-358762

(51) Int. Cl.
H04B 1/38 (2006.01)
H01Q 11/12 (2006.01)

(52) U.S. Cl. ................. 455/572; 455/574; 455/115.1; 455/127.1

(58) Field of Classification Search ................. 455/572, 455/574, 115.1, 127.1–127.5, 522
See application file for complete search history.

(56) References Cited

U.S. PATENT DOCUMENTS

| | | | |
|---|---|---|---|
| 5,546,051 A | | 8/1996 | Koizumi et al. |
| 5,977,833 A * | | 11/1999 | Attimont et al. ............... 330/297 |
| 6,064,857 A * | | 5/2000 | Wiedeman et al. ......... 455/127.4 |
| 6,163,706 A * | | 12/2000 | Rozenblit et al. ............. 455/522 |
| 6,349,216 B1 * | | 2/2002 | Alberth et al. ............. 455/550.1 |
| 6,374,127 B1 * | | 4/2002 | Park .............................. 455/572 |
| 6,774,725 B2 | | 8/2004 | Miki et al. |
| 6,781,452 B2 | | 8/2004 | Cioffi et al. |
| 2004/0185803 A1 * | | 9/2004 | Tanabe et al. ................. 455/108 |
| 2004/0198263 A1 * | | 10/2004 | Ode et al. .................... 455/115.1 |
| 2005/0101263 A1 * | | 5/2005 | Kim ................................ 455/78 |
| 2006/0057978 A1 * | | 3/2006 | Love et al. ................. 455/127.1 |

FOREIGN PATENT DOCUMENTS

| | | |
|---|---|---|
| EP | 1 530 303 | 5/2005 |
| JP | 2001-68941 | 3/2001 |
| JP | 2001-320288 | 11/2001 |
| JP | 2003-189603 A | 7/2003 |
| JP | 2004-88520 | 3/2004 |
| JP | 2004-336626 | 11/2004 |
| WO | WO 2004/019486 A1 | 8/2002 |
| WO | WO 2005/076467 | 8/2005 |

OTHER PUBLICATIONS

Chinese Office Action with English Translation.
Japanese Office Action with partial translation.
Japanese Office Action with partial translation, Dec. 8, 2009.
Chinese Office Action with English Translation, Dec. 5, 2008.

* cited by examiner

Primary Examiner — Lester Kincaid
Assistant Examiner — Daniel Lai
(74) Attorney, Agent, or Firm — Whitham Curtis Christofferson & Cook, PC

(57) ABSTRACT

In a voltage supply control device, a voltage conversion circuit receives a voltage from a battery and generates a desired voltage. A switching control unit executes switching so as to supply a voltage to a power amplification circuit through the voltage conversion circuit when the voltage of the battery is equal to or more than a predetermined threshold value or supply the voltage to the power amplification circuit from the battery without intervention of the voltage conversion circuit when the voltage of the battery is less than the predetermined threshold value. The switching control unit uses different voltage threshold values for a plurality of transmission modes classified in accordance with the assumed values of appropriate voltages to be supplied to the power amplification circuit. A cellular phone terminal and a voltage supply control method are also disclosed.

7 Claims, 15 Drawing Sheets

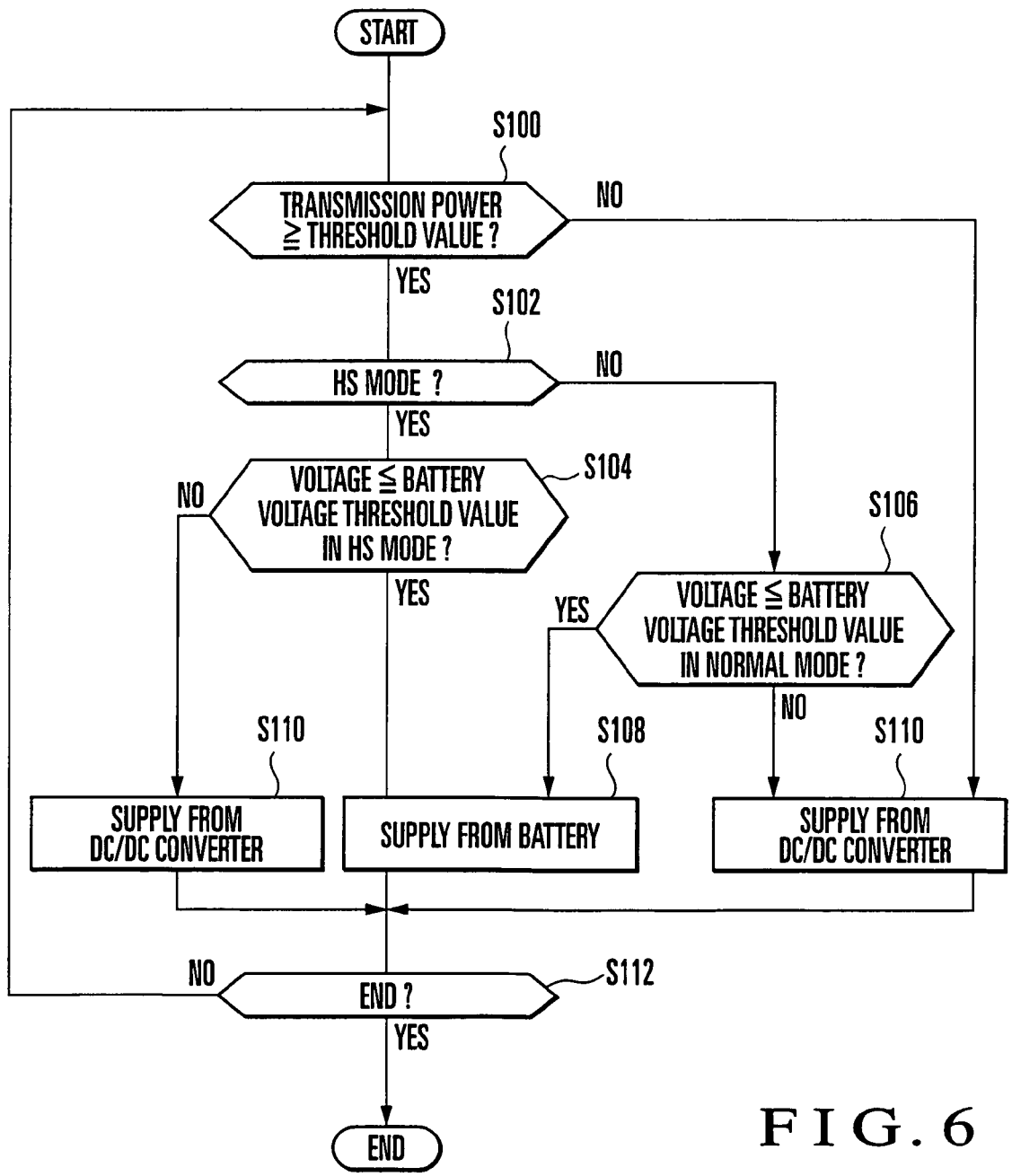

| MODE | VOLTAGE THRESHOLD VALUE |
|---|---|
| HS MODE 1 | 3.9V |
| HS MODE 2 | 3.8V |
| NORMAL MODE | 3.6V |

1400

| MODE | VOLTAGE THRESHOLD VALUE | TRANSMISSION POWER THRESHOLD VALUE |
|---|---|---|
| HS MODE 1 | 3.9V | 20dBm |
| HS MODE 2 | 3.8V | 21dBm |
| NORMAL MODE | 3.6V | 21dBm |

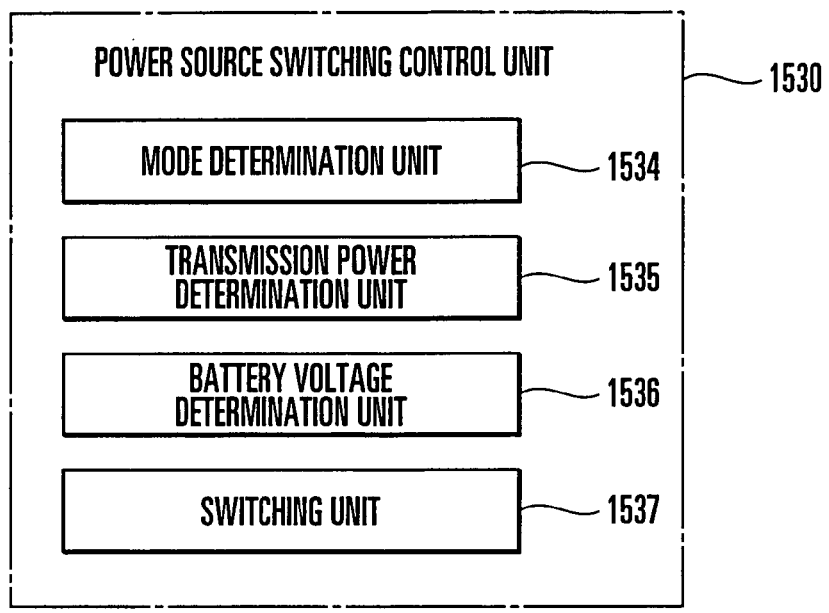
F I G. 15
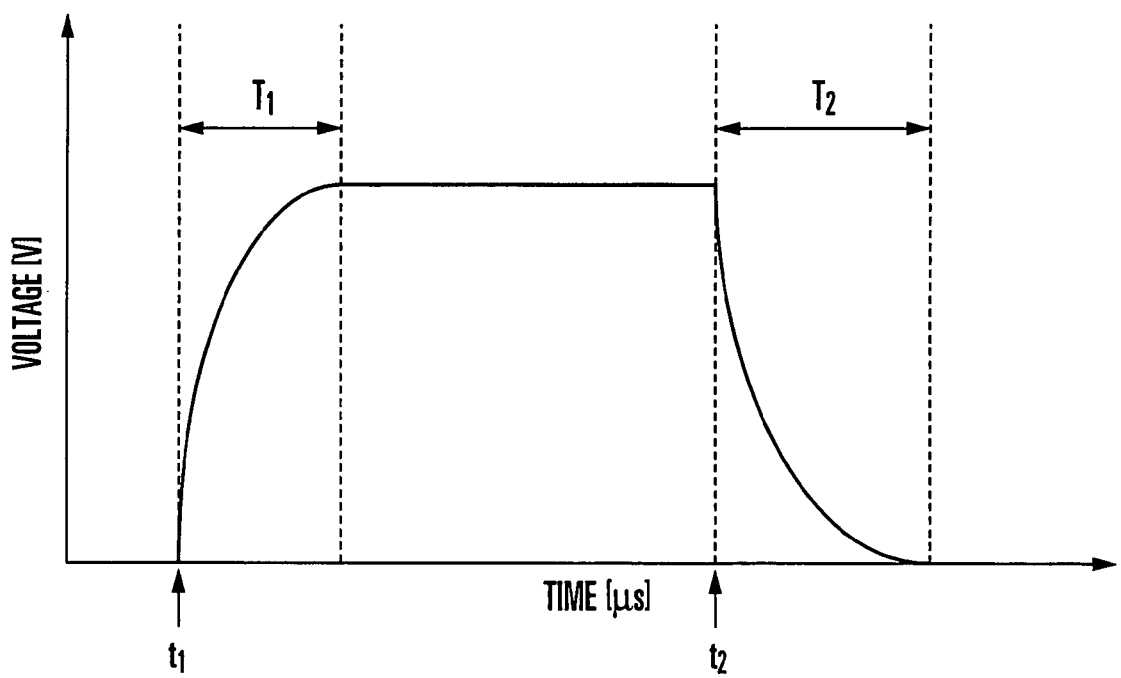
F I G. 16

VOLTAGE SUPPLY CONTROL DEVICE AND VOLTAGE SUPPLY CONTROL METHOD

BACKGROUND OF THE INVENTION

The present invention relates to a voltage supply control device and voltage supply control method.

As disclosed in reference 1 (Japanese Patent Laid-Open No. 2003-189603), in a conventional WCDMA cellular phone terminal, the battery voltage is dropped by a DC/DC converter in the power supply device in accordance with transmission power. The voltage is dropped to such a level not to distort a signal and supplied to a power amplification circuit such as a power amplifier. With this method, the power added efficiency of the power amplifier is increased, and the current consumption is reduced.

However, if the battery voltage decreases in dropping the voltage by the DC/DC converter and supplying the voltage to the power amplifier, the current consumption of the DC/DC converter increases, and no necessary voltage can be supplied. As a result, the RF characteristic degrades.

SUMMARY OF THE INVENTION

The present invention has been made in consideration of this situation, and has as its object to provide a technique of suppressing current consumption in transmitting a signal from a cellular phone terminal while maintaining a satisfactory RF characteristic.

In order to achieve the above object, according to the present invention, there is provided a voltage supply control device comprising a voltage conversion circuit which receives a voltage from a battery and generates a desired voltage, and a switching control unit which executes switching so as to supply a voltage to a power amplification circuit to amplify a transmission signal through the voltage conversion circuit when the voltage of the battery is not less than a predetermined threshold value or supply the voltage to the power amplification circuit from the battery without intervention of the voltage conversion circuit when the voltage of the battery is less than the predetermined threshold value, the switching control unit using different voltage threshold values for a plurality of transmission modes classified in accordance with assumed values of appropriate voltages to be supplied to the power amplification circuit.

There is also provided a cellular phone terminal comprising a battery, an RF device which includes a power amplification circuit to amplify a transmission signal, a voltage supply control device which supplies a voltage from the battery to the power amplification circuit, a digital signal processing device which notifies the voltage supply control device of a transmission mode, a CPU device which notifies the voltage supply control device whether the voltage of the battery is not less than a voltage threshold value in each of a plurality of transmission modes, the CPU device using different voltage threshold values for the plurality of transmission modes classified in accordance with assumed values of appropriate voltages to be supplied to the power amplification circuit, and an antenna which transmits the transmission signal from the RF device, the voltage supply control device comprising a voltage conversion circuit which receives the voltage from the battery and generates a desired voltage, and a switching control unit which determines on the basis of information from each of the digital signal processing device and the CPU device whether the voltage of the battery is not less than the voltage threshold value in the transmission mode given by the digital signal processing device and executes switching so as to supply the voltage to the power amplification circuit through the voltage conversion circuit when the voltage of the battery is not less than the threshold value or supply the voltage from the battery without intervention of the voltage conversion circuit when the voltage of the battery is less than the threshold value.

There is also provided a voltage supply control method comprising the step of determining whether a voltage of a battery is not less than a voltage threshold value in a transmission mode, in which different threshold values are used for a plurality of transmission modes classified in accordance with assumed values of appropriate voltages to be supplied to a power amplification circuit to amplify a transmission signal, the step of causing a voltage conversion circuit to convert the voltage from the battery into a desired voltage and supplying the voltage to the power amplification circuit when the voltage of the battery is not less than the threshold value, and the step of supplying the voltage from the battery to the power amplification circuit without intervention of the voltage conversion circuit when the voltage of the battery is less than the threshold value.

BRIEF DESCRIPTION OF THE DRAWINGS

FIG. 5 is a view showing an example of the internal arrangement of a memory device;

FIG. 6 is a flowchart showing control procedures for causing a power source switching control device to switch the voltage source to the power amplifier;

FIG. 15 is a view showing an example of the internal arrangement of the power source switching control device;

FIG. 16 is a graph showing the rise and fall characteristic of a DC/DC converter;

DESCRIPTION OF THE PREFERRED EMBODIMENTS

Figure 1:
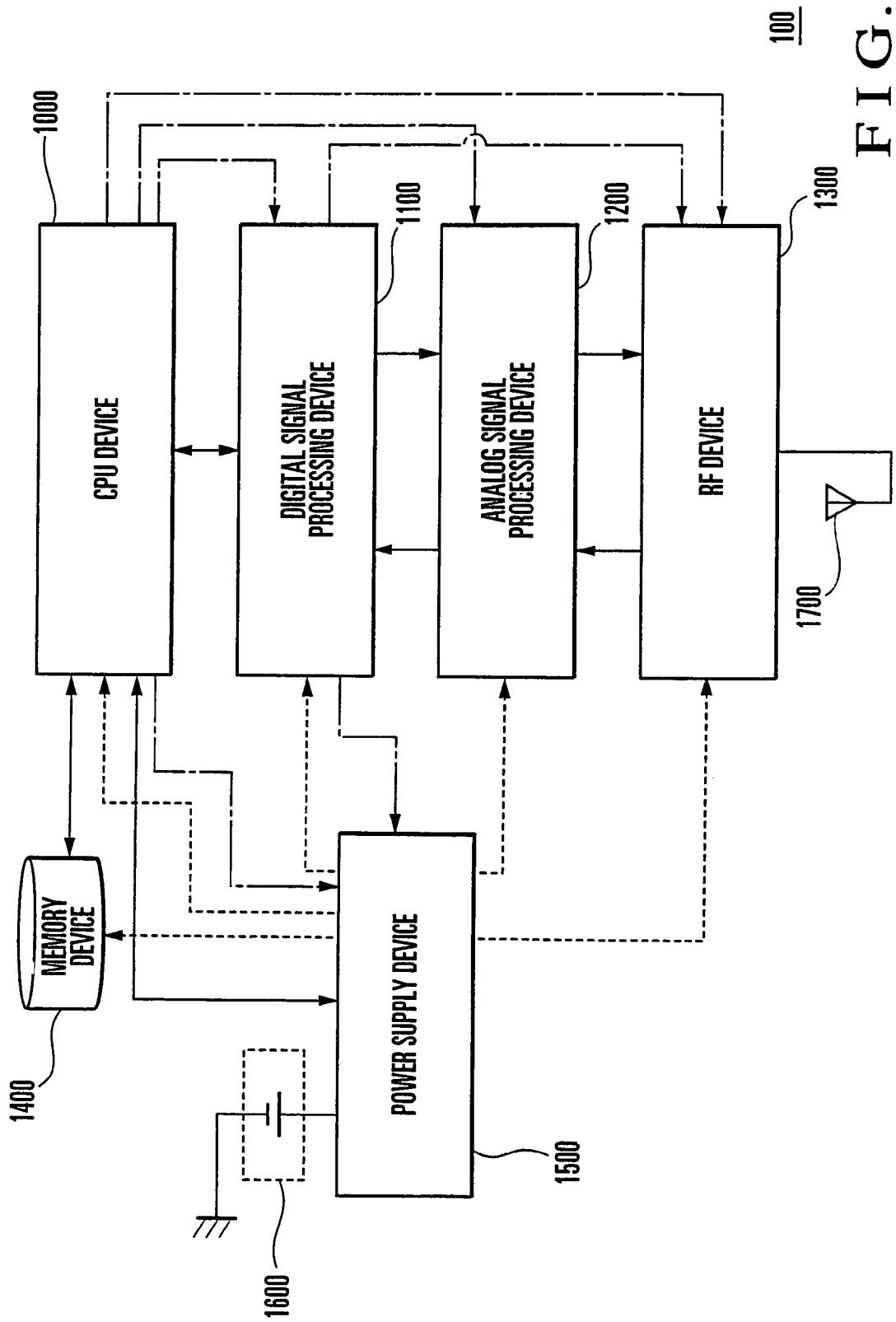
FIG. 1 is a block diagram showing the arrangement of a cellular phone terminal according to the first embodiment of the present invention.

The embodiments of the present invention will be described below with reference to the accompanying drawings. The same reference numerals denote the same constituent elements throughout the drawings, and a description thereof will be omitted appropriately.

In the following embodiments, a cellular phone terminal is compatible with HSDPA (High Speed Downlink Packet Access) of WCDMA (Wide-band Code Division Multiple Access). WCDMA is a communication scheme approved by 3GPP (3rd Generation Partnership Project). In HSDPA, the data transmission rate receivable by a cellular phone terminal is increased by combining WCDMA with a technique of switching the modulation scheme to an optimum one in accordance with the reception state and a technique of suppressing the number of times of retransmission of error data.

First Embodiment

FIG. 1 shows the arrangement of a cellular phone terminal according to this embodiment. Referring to FIG. 1, data lines are indicated by solid arrows, power supply lines are indicated by dotted arrows, and control lines are indicated by alternate long and short dashed arrows.

A cellular phone terminal 100 includes a CPU device 1000, digital signal processing device 1100, analog signal processing device 1200, RF device 1300, memory device (storage unit) 1400, power supply device (voltage supply control device) 1500, battery 1600, and antenna 1700.

In this embodiment, the cellular phone terminal 100 switches the source of a voltage to be supplied to the power amplifier in the RF device 1300 between a path through the DC/DC converter in the power supply device 1500 and a path from the battery 1600 without intervention of the DC/DC converter in accordance with the mode of a transmission signal, the transmission power of the transmission signal, and the voltage of the battery 1600. With this arrangement, any degradation in RF characteristic (especially, ACLR (Adjacent Channel Leakage power Ratio)) can be suppressed, and the current consumption can be reduced.

The CPU device 1000 controls the digital signal processing device 1100, analog signal processing device 1200, RF device 1300, memory device 1400, and power supply device 1500. The CPU device 1000 also transmits/receives data to/from the digital signal processing device 1100, memory device 1400, and power supply device 1500.

The RF device 1300 modulates/demodulates a radio signal.

Figure 2:
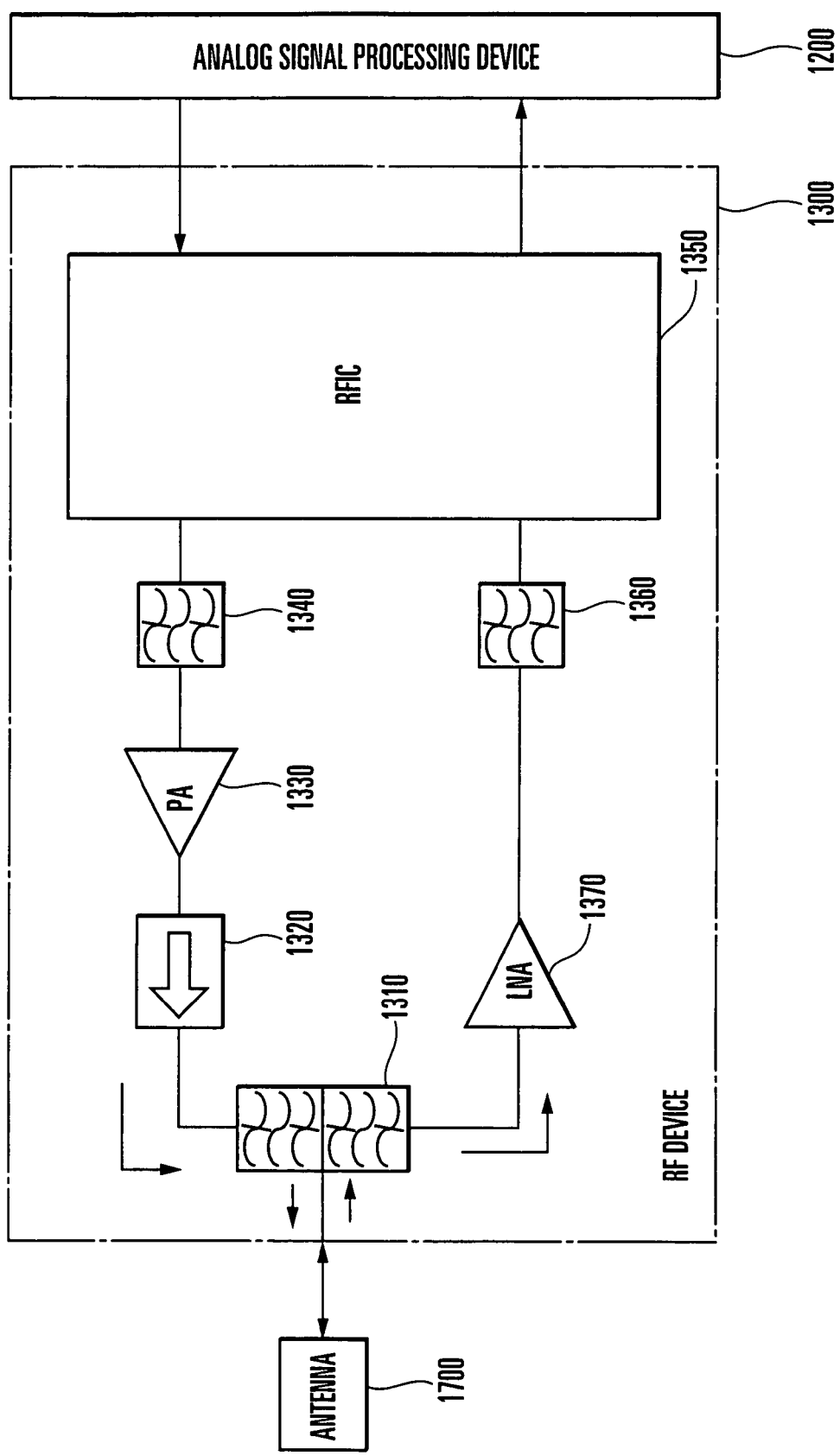
FIG. 2 is a block diagram showing the detailed arrangement of an RF device.

FIG. 2 shows the detailed arrangement of the RF device 1300.

The RF device 1300 includes a duplexer 1310, isolator 1320, power amplifier (power amplification circuit) 1330, first attenuation filter 1340, RFIC (Radio Frequency Integrated Circuit) 1350, second attenuation filter 1360, and low noise amplifier 1370.

The duplexer 1310 is a filter to separate a transmission signal and reception signal. The isolator 1320 prevents backflow of a high-power signal. The power amplifier (PA) 1330 amplifies an input signal to a high-power signal. The first attenuation filter (BPF) 1340 attenuates signals except the transmission signal. The RFIC 1350 includes a signal modulation/demodulation circuit, baseband filter, amplifier, and PLL synthesizer. The second attenuation filter (BPF) 1360 attenuates signals except the reception signal. The low noise amplifier (LNA) 1370 reduces noise and amplifies a signal.

Figure 3:
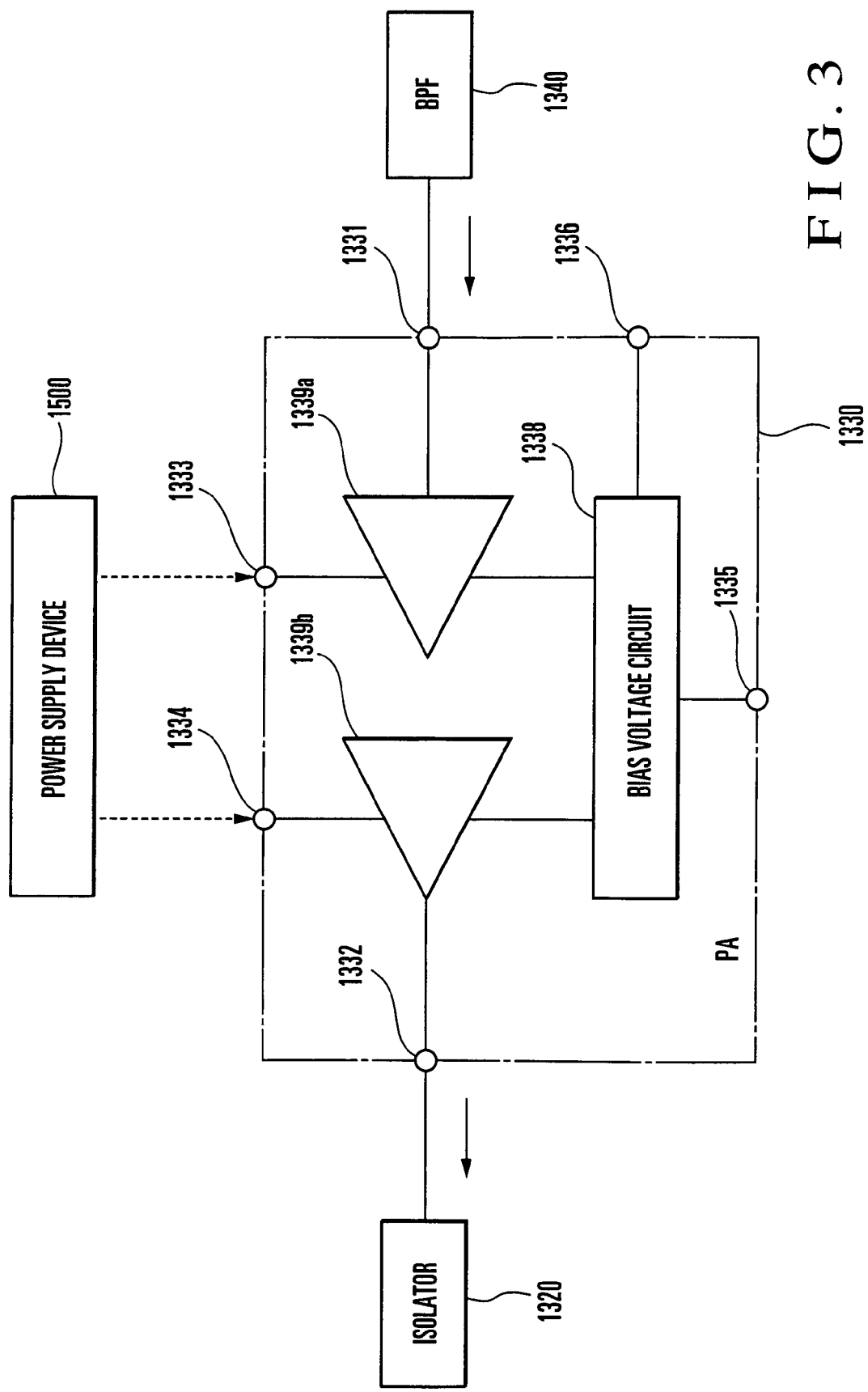
FIG. 3 is a block diagram showing the detailed arrangement of a power amplifier.

FIG. 3 shows the detailed arrangement of the power amplifier 1330.

FIG. 3 shows an HBT (Heterojunction Bipolar Transistor) power amplifier 1330. The power amplifier 1330 has a driving amplifier 1339a, output amplifier 1339b, and bias voltage circuit 1338. The RF device 1300 has six signal input/output terminals, i.e., a signal input terminal 1331, signal output terminal 1332, driving amplifier power supply voltage terminal 1333, output amplifier power supply voltage terminal 1334, bias voltage circuit voltage terminal 1335, and bias voltage adjustment voltage terminal 1336.

Referring back to FIG. 1, the analog signal processing device 1200 executes AD/DA conversion. The analog signal processing device 1200 A/D-converts a signal sent from the RF device 1300 and sends the converted signal to the digital signal processing device 1100. The analog signal processing device 1200 also D/A-converts a signal sent from the digital signal processing device 1100 and sends the converted signal to the RF device 1300.

The digital signal processing device 1100 executes digital signal processing. The digital signal processing device 1100 executes modulation/demodulation and sends the decoded signal to the CPU device 1000. The digital signal processing device 1100 also performs power management of the transmission/reception signal. If the transmission power has a set threshold value or more, the digital signal processing device 1100 notifies the power supply device 1500 of it.

The memory device 1400 stores control information and the like. The CPU device 1000 reads out/writes information from/in the memory device 1400 in accordance with control. An example of the internal arrangement of the memory device 1400 will be described later.

The power supply device 1500 supplies a power to the CPU device 1000, digital signal processing device 1100, analog signal processing device 1200, RF device 1300, and memory device 1400 under the control of the CPU device 1000.

Figure 4:
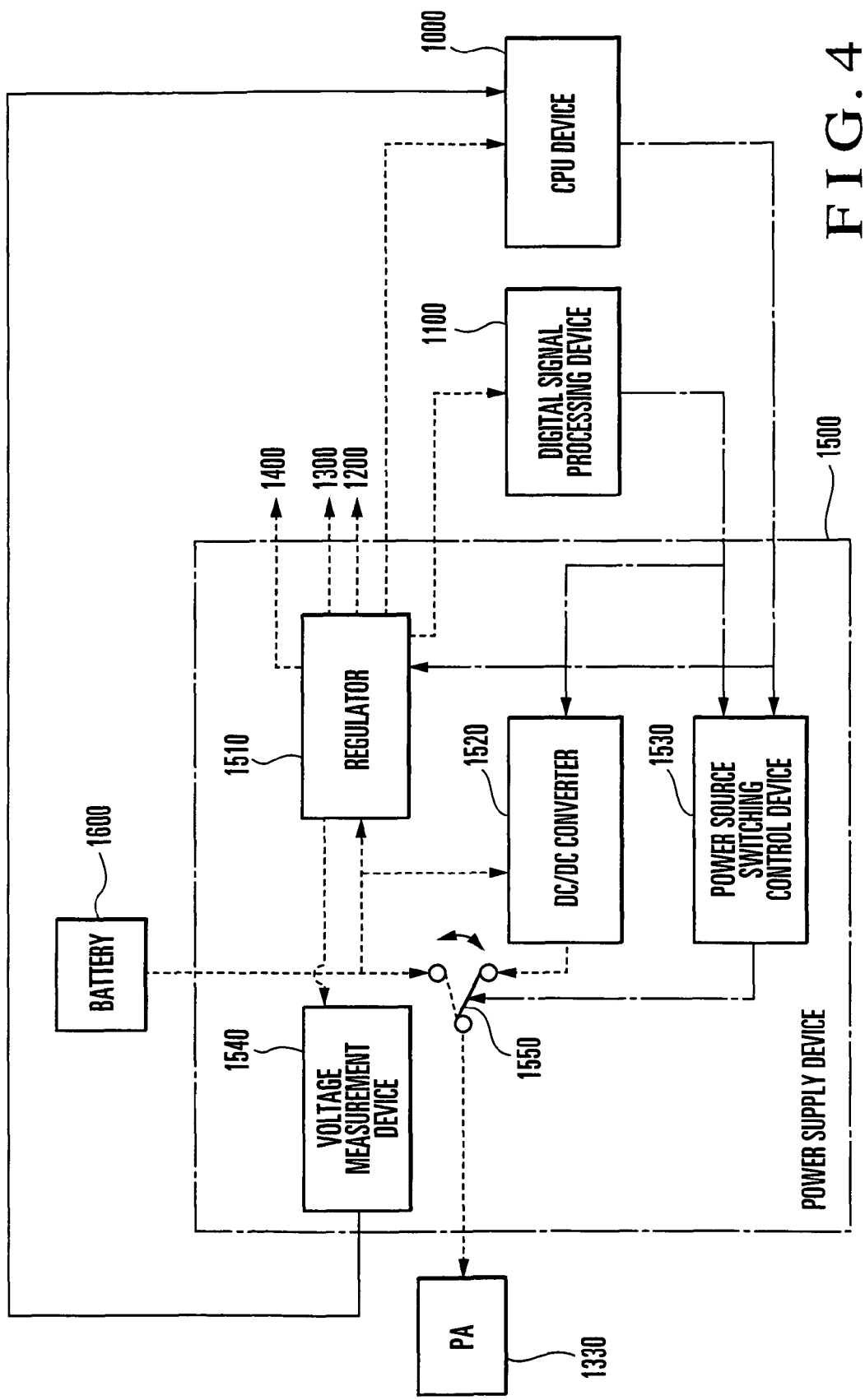
FIG. 4 is a block diagram showing the detailed arrangement of a power supply device.

FIG. 4 shows the detailed arrangement of the power supply device 1500.

The power supply device 1500 includes a regulator 1510, DC/DC converter (voltage conversion circuit) 1520, power source switching control device 1530, voltage measurement device 1540, and switch 1550.

The regulator 1510 receives a voltage supplied from the battery 1600 and makes the voltage flat and constant. Then, the regulator 1510 supplies the power to the CPU device 1000, digital signal processing device 1100, analog signal processing device 1200, RF device 1300, and memory device 1400. For example, the voltage regulated by the regulator 1510 is supplied to the bias voltage circuit voltage terminal 1335 and bias voltage adjustment voltage terminal 1336 (FIG. 3) of the power amplifier 1330.

The DC/DC converter 1520 receives a voltage from the battery 1600, changes the output voltage under the control of the digital signal processing device 1100, and supplies the voltage to the power amplifier 1330. In this embodiment, the voltage from the DC/DC converter 1520 is supplied to the driving amplifier power supply voltage terminal 1333 and output amplifier power supply voltage terminal 1334 of the power amplifier 1330. In the following description, voltage supply to the power amplifier 1330 indicates voltage supply to the driving amplifier power supply voltage terminal 1333 and output amplifier power supply voltage terminal 1334, unless otherwise specified.

The power source switching control device 1530 controls the switch 1550 to switch the voltage source to the power amplifier 1330 between the path through the DC/DC converter 1520 and the path from the battery 1600 without intervention of the DC/DC converter 1520 under the control of the CPU device 1000 and digital signal processing device 1100. The voltage measurement device 1540 measures the voltage of the battery 1600 and notifies the CPU device 1000 of the result.

Referring back to FIG. 1, the battery 1600 supplies a voltage to the constituent elements of the entire apparatus. As will be described later, the battery 1600 supplies a voltage to the power amplifier 1330 of the RF device 1300 in accordance with the situation. The antenna 1700 receives a signal from a base station (not shown) and outputs the signal to the RF device 1300. The antenna 1700 also transmits a signal from the RF device 1300.

In the cellular phone terminal 100 compatible with WCDMA, the battery voltage from the battery 1600 is dropped to an optimum voltage by the DC/DC converter 1520 in the power supply device 1500 in accordance with the transmission power of a transmission signal. Then, the voltage is supplied to the power amplifier 1330 of the RF device 1300. With the processing, the signal can be amplified by the RF device 1300 without any distortion. In addition, the DC power supplied from the battery 1600 to the RF device 1300 can be converted into an RF power at a high efficiency (high power added efficiency). As a result, the current consumption can be reduced.

However, when the battery voltage of the battery 1600 drops to certain level, the current consumption of the DC/DC converter 1520 increases. In addition, when the voltage is supplied to the power amplifier 1330 through the DC/DC converter 1520, the supplied voltage becomes lower by 0.1 to 0.5 V than a case wherein the voltage is supplied from the battery 1600 without intervention of the DC/DC converter 1520. Hence, when an especially high power should be output, the voltage required by the power amplifier 1330 cannot be supplied. It is difficult for the power amplifier 1330 to amplify the signal without distortion, and the RF characteristic degrades greatly. To prevent this, when the battery voltage of the battery 1600 has a predetermined value or less, voltage supply through the DC/DC converter 1520 is stopped. Instead, the voltage is supplied from the battery 1600 without intervention of the DC/DC converter 1520. With this arrangement, the current consumption can be suppressed low. Furthermore, the voltage supplied to the power amplifier 1330 can be higher by 0.1 to 0.5 V than in voltage supply through the DC/DC converter 1520. Hence, the degradation in RF characteristic can be avoided.

In HSDPA, a new channel HS-DPCCH to transmit HSDPA control information is prepared for transmission/reception. In the cellular phone terminal compatible with HSDPA, the HS-DPCCH signal is added and multiplexed on the conventional signal channel DPCCH (Dedicated Physical Control CHannel; one of DPCHs (Dedicated Physical CHannels, DCH transfer physical channels) which is used for control information; both the bit rate and the SF are variable) and DPBCH (Dedicated Physical Data CHannel; one of DPCHs which is used for data transfer; both the bit rate and the SF are variable) and received/transmitted.

A state wherein when HS-DPCCH is multiplexed, and received data is correctly decoded, an ACK signal is transmitted to the base station, or otherwise, an NACK signal serving as a retransmission request or a CQI (Channel Quality Indicator) signal representing the situation of the transmission channel is transmitted to the base station will be referred to as an HS mode hereinafter. A mode except it will be referred to as a normal mode. In the HS mode, since the HS-DPCCH signal is added and multiplexed, the PAR (Peak to Average Ratio; to be simply referred to as a "PAR" hereinafter) in the power amplifier 1330 becomes larger than in the normal mode. For example, generally, the PAR is about 3 dB in the normal mode and about 5 dB in the HS mode. Hence, the maximum output power of the power amplifier 1330 which executes maximum power amplification on the transmission path in the RF device 1300 must be set large to prevent distortion of a signal. To do this, the supplied voltage must be higher in the HS mode than in the normal mode. That is, the voltage which must be supplied to the power amplifier 1330 changes depending on the mode.

Conventionally, in switching from, e.g., the normal mode to the HS mode or conversely from the HS mode to the normal mode, appropriate switching control of the voltage source to the power amplifier 1330 in accordance with a decrease/ increase in voltage of the battery 1600 is not taken into consideration. Since no appropriate switching control of the voltage source to the power amplifier 1330 is executed depending on the mode, for example, the RF characteristic may degrade in the HS mode, or the power added efficiency of the RF device 1300 may decrease, and the current consumption may increase in the normal mode.

In this embodiment, to solve the above-described problems, the threshold value of the voltage of the battery 1600, which serves as a reference to switch the voltage source to the power amplifier 1330, is changed depending on the mode.

In this embodiment, the digital signal processing device 1100 executes multiplex and spread processing of a signal containing HS-DPCCH and sends the signal to the analog signal processing device 1200. The digital signal processing device 1100 also decodes an HSDPA reception signal, creates an ACK signal, NACK signal, or CQI signal on the basis of the signal decoding state (OK or NG) or a result obtained by measuring the transmission channel state, and sends the signal to the analog signal processing device 1200. The digital signal processing device 1100 also manages the timing of HS-DPCCH transmission or a reception signal and notifies the power supply device 1500 of the transmission timing in the normal mode or HS mode.

FIG. 5 shows an example of the internal arrangement of the memory device 1400.

In this embodiment, the memory device 1400 stores the threshold value of the voltage of the battery 1600, which is used to switch the voltage source to the power amplifier 1330 between the DC/DC converter 1520 and the battery 1600 for each of the HS mode and normal mode. The voltage threshold value of each mode can be determined on the basis of, e.g., a measured value.

Referring back to FIG. 1, the CPU device 1000 refers to the memory device 1400, and every time the voltage of the battery 1600 is equal to or less than the voltage threshold value in the HS mode or normal mode, notifies the power supply device 1500 of it. The digital signal processing device 1100 notifies the power supply device 1500 of the correct timing of the HS mode or normal mode. Hence, the power supply device 1500 can execute voltage source switching control corresponding to the mode. In the HS mode, any degradation in RF characteristic can be prevented. In the normal mode, the current consumption can be suppressed.

FIG. 6 shows control procedures for causing the power source switching control device 1530 to switch the voltage source to the power amplifier 1330. This will be described below also with reference to FIGS. 1 to 5.

The digital signal processing device 1100 notifies the power source switching control device 1530 whether the mode is the HS mode or normal mode and whether the transmission power is equal to or more than the threshold value. In this embodiment, the CPU device 1000 notifies the power source switching control device 1530 whether the voltage of the battery 1600 is equal to or more than the threshold value in the HS mode or whether the voltage of the battery 1600 is equal to or more than the threshold value in the normal mode.

First, the power source switching control device 1530 determines on the basis of the notification from the digital signal processing device 1100 whether the transmission power is equal to or more than the threshold value (S100). If the transmission power is not equal to or more than the threshold value (NO in step S100), the voltage source to the power amplifier 1330 is switched to the DC/DC converter 1520 (S110).

If the transmission power is equal to or more than the threshold value in step S100 (YES in step S100), the power source switching control device 1530 determines on the basis of the notification from the digital signal processing device 1100 whether the mode is the HS mode or normal mode (S102). If the mode is the HS mode (YES in step S102), the power source switching control device 1530 determines on the basis of the notification from the CPU device 1000 whether the voltage of the battery 1600 is equal to or less than the battery voltage threshold value in the HS mode (S104). If the voltage of the battery 1600 is not equal to or less than the battery voltage threshold value in the HS mode (NO in step S104), the voltage source to the power amplifier 1330 is set to the DC/DC converter 1520 (S110). If the voltage of the battery 1600 is equal to or less than the battery voltage threshold value in the HS mode in step S104 (YES in step S104), the voltage source to the power amplifier 1330 is set to the battery 1600 (S108). Supplying the voltage from the battery 1600 to the power amplifier 1330 without intervention of the DC/DC converter 1520 will be simply referred to as "setting the voltage source to the battery 1600" hereinafter.

If the mode is not the HS mode in step S102 (NO in step S102), the power source switching control device 1530 determines on the basis of the notification from the CPU device 1000 whether the voltage of the battery 1600 is equal to or less than the battery voltage threshold value in the normal mode (S106). If the voltage of the battery 1600 is not equal to or less than the battery voltage threshold value in the normal mode (NO in step S106), the voltage source to the power amplifier 1330 is set to the DC/DC converter 1520 (S110). If the voltage of the battery 1600 is equal to or less than the battery voltage threshold value in the normal mode in step S106 (YES in step S106), the voltage source to the power amplifier 1330 is set to the battery 1600 (S108).

After the above-described processing, it is determined whether to end the processing (S112). If the processing is not to be ended (NO in step S112), the flow returns to step S100 to repeat the same processing. If the processing should be ended in step S112 (YES in step S112), the processing is ended.

Figure 7:
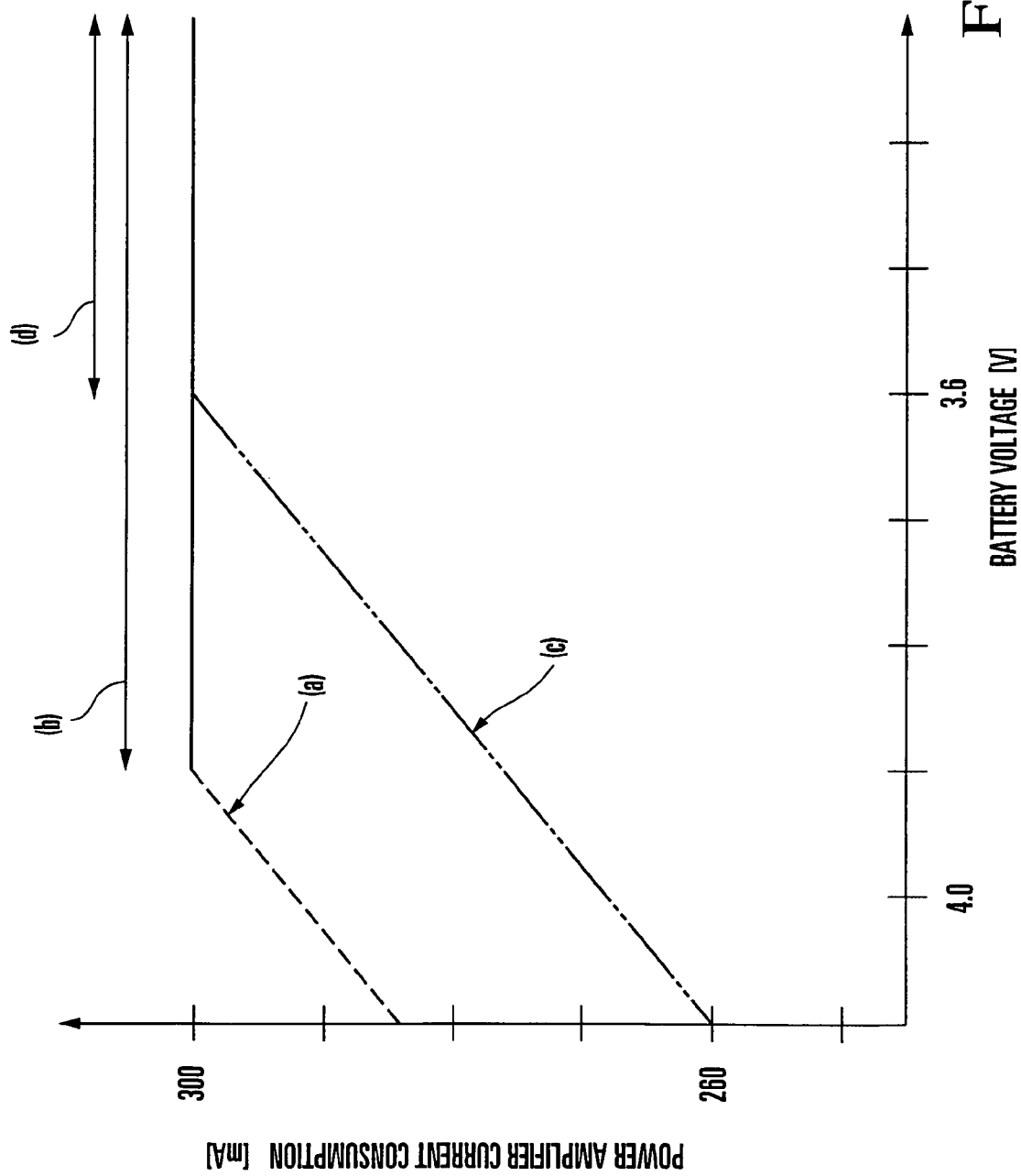
FIG. 7 is a graph showing the relationship between the current consumption of the power amplifier and the voltage of a battery 1600 in the HS mode and normal mode.

FIG. 7 shows the relationship between the current consumption of the power amplifier 1330 and the voltage of the battery 1600 in the HS mode and normal mode. In this example, the transmission power is 24 dBm. Referring to FIG. 7, (a) indicates a case wherein a voltage of 3.9 V is supplied to the power amplifier 1330 through the DC/DC converter 1520 in the HS mode, (b) indicates a case wherein a voltage is supplied from the battery 1600 in the HS mode, (c) indicates a case wherein a voltage of 3.6 V is supplied through the DC/DC converter 1520 in the normal mode, and (d) indicates a case wherein a voltage is supplied from the battery 1600 in the normal mode.

As described above, the PAR value changes between the HS mode and the normal mode. For this reason, the optimum voltage to be supplied to the power amplifier 1330, i.e., the voltage not to degrade the RF characteristic is higher in the HS mode than in the normal mode. Hence, larger current consumption is necessary in the HS mode than in the normal mode. In the HS mode, a voltage of 3.9 V is supplied from the DC/DC converter 1520 to the power amplifier 1330. In the normal mode, a voltage of 3.6 V is supplied.

When the voltage of the battery 1600 is high, the current consumption of the power amplifier 1330 can be reduced by supplying the voltage to the power amplifier 1330 through the DC/DC converter 1520. However, as the voltage of the battery 1600 drops, the current consumption of the power amplifier 1330 increases if the voltage is supplied to the power amplifier 1330 through the DC/DC converter 1520. To prevent degradation in RF characteristic, the voltage source to the power amplifier 1330 needs to be switched from the DC/DC converter 1520 to the battery 1600 in accordance with the voltage of the battery 1600. A higher voltage must be supplied to the power amplifier 1330 in the HS mode than in the normal mode. Hence, the threshold voltage to switch the voltage source to the power amplifier 1330 from the DC/DC converter 1520 to the battery 1600 is also higher in the HS mode. In this case, the threshold value to switch the voltage source to the power amplifier 1330 can be set to, e.g., 3.9 V in the HS mode and 3.6 V in the normal mode.

An example will be described next with reference to FIGS. 6 and 7, in which the transmission power threshold value is 20 dBm, the power source switching voltage threshold value of the battery 1600 in the HS mode is 3.9 V, and the power source switching voltage threshold value of the battery 1600 in the normal mode is 3.6 V. The transmission power is 24 dBm.

Since the transmission power is 24 dBm, and the transmission power threshold value is 20 dBm or more, the digital signal processing device 1100 notifies the power supply device 1500 that the transmission power is equal to or more than the threshold value. On the basis of this notification, the power source switching control device 1530 of the power supply device 1500 determines that the transmission power is equal to or more than the threshold value (YES in step S100).

When the voltage of the battery 1600, which is given by the voltage measurement device 1540 of the power supply device 1500, drops to 3.9 V or less, the voltage is equal to or less than the battery voltage threshold value in the HS mode. Hence, the CPU device 1000 notifies the power supply device 1500 that the voltage is equal to or less than the battery voltage threshold value in the HS mode. Simultaneously, the digital signal processing device 1100 notifies the power source switching control device 1530 that the mode is the HS mode or normal mode. On the basis of these notifications, if the mode is the HS mode (YES in step S102), the voltage is equal to or less than the battery voltage threshold value (YES in step S104). Hence, the power source switching control device 1530 switches the voltage source to the power amplifier 1330 from the DC/DC converter 1520 to the battery 1600 (S108). If the mode is the normal mode (NO in step S102), the voltage is not equal to or less than the battery voltage threshold value (NO in step S106). Hence, the power source switching control device 1530 maintains the DC/DC converter 1520 as the voltage source to the power amplifier 1330 (S110).

When the voltage of the battery 1600, which is given by the voltage measurement device 1540 of the power supply device 1500, drops to 3.6 V or less, the voltage is equal to or less than the battery voltage threshold value in the normal mode. Hence, the CPU device 1000 notifies the power supply device 1500 that the voltage is equal to or less than the battery voltage threshold value in the normal mode. Simultaneously, the digital signal processing device 1100 notifies the power source switching control device 1530 that the mode is the HS mode or normal mode. On the basis of these notifications, if the mode is the HS mode (YES in step S102), the voltage is equal to or less than the battery voltage threshold value (YES in step S104). Hence, the power source switching control device 1530 maintains the battery 1600 as the voltage source to the power amplifier 1330 (S108). Even when the mode is the normal mode (NO in step S102), the voltage is equal to or less than the battery voltage threshold value (YES in step S106). Hence, the power source switching control device 1530 switches the voltage source to the power amplifier 1330 from the DC/DC converter 1520 to the battery 1600 (S108).

When the battery 1600 is charged, and its voltage rises, reverse processing is executed. When the voltage of the battery 1600, which is given by the voltage measurement device 1540 of the power supply device 1500, exceeds 3.6 V, the voltage is more than the battery voltage threshold value in the normal mode. Hence, the CPU device 1000 notifies the power supply device 1500 that the voltage is more than the battery voltage threshold value in the normal mode. Simultaneously, the digital signal processing device 1100 notifies the power source switching control device 1530 that the mode is the HS mode or normal mode. On the basis of these notifications, if the mode is the normal mode (NO in step S102), the voltage is more than the battery voltage threshold value (NO in step S106). Hence, the power source switching control device 1530 switches the voltage source to the power amplifier 1330 to the DC/DC converter 1520 (S110). If the mode is the HS mode (YES in step S102), it is determined whether the voltage is more than the battery voltage threshold value (S104). If the voltage is equal to or less than the voltage threshold value (YES in step S104), the power source switching control device 1530 maintains the battery 1600 as the voltage source to the power amplifier 1330 (S108).

When the voltage of the battery 1600, which is given by the voltage measurement device 1540 of the power supply device 1500, exceeds 3.9 V, the voltage is more than the battery voltage threshold value in the HS mode. Hence, the CPU device 1000 notifies the power supply device 1500 that the voltage is more than the battery voltage threshold value in the HS mode. Simultaneously, the digital signal processing device 1100 notifies the power source switching control device 1530 that the mode is the HS mode or normal mode. On the basis of these notifications, if the mode is the normal mode (NO in step S102), the voltage is more than the battery voltage threshold value (NO in step S106). Hence, the power source switching control device 1530 maintains the DC/DC converter 1520 as the voltage source to the power amplifier 1330 (S110). If the mode is the HS mode (YES in step S102), it is determined whether the voltage is more than the battery voltage threshold value (S104). Since the voltage is more than the voltage threshold value (NO in step S104), the power source switching control device 1530 switches the voltage source to the power amplifier 1330 to the DC/DC converter 1520 (S110).

According to the cellular phone terminal 100 of this embodiment, the voltage threshold value to switch the voltage source to the power amplifier 1330 from the DC/DC converter 1520 to the battery 1600 or from the battery 1600 to the DC/DC converter 1520 can be set for each mode. For this reason, in, e.g., the HS mode with a larger PAR, degradation in RF characteristic can be suppressed. In the normal mode, the current consumption can be reduced.

Second Embodiment

In the first embodiment, the voltage threshold value in switching control of the voltage source to the power amplifier 1330 is changed depending on whether the mode of the transmission signal is the HS mode or normal mode. In the second embodiment, the voltage threshold value changes between subdivided modes. In this embodiment, the modes can be subdivided by, e.g., classification based on β ratio combinations, classification based on PAR values, or classification based on ACLR values.

A cellular phone terminal 100 of this embodiment has the same constituent elements as in the first embodiment.

For example, the assumed value of an optimum voltage to be supplied to a power amplifier 1330, i.e., the assumed value of the voltage not to degrade the RF characteristic changes depending on the β ratio combination, or the difference in PAR value or ACLR value. For this reason, the battery voltage threshold value to switch the voltage source to the power amplifier 1330 from a DC/DC converter 1520 to a battery 1600 also preferably changes depending on these differences. With this arrangement, since voltage supply to the power amplifier 1330 can finely be controlled, reduction of current consumption and suppression of degradation in RF characteristic can be implemented more effectively.

(a) β Ratio Combination

For example, in the HS mode, the optimum voltage to be supplied to the power amplifier 1330, i.e., the voltage not to degrade the RF characteristic changes depending on the combination of βd as the β ratio of DPDCH, βc as the β ratio of DPCCH, or βHS as the β ratio of HS-DPCCH.

When a signal is transmitted at a transmission rate of 12.2 kbps in the normal mode, the β ratio is defined as, e.g., a 3GPP reference parameter to satisfy βc:βd=8:15. This corresponds to −5.46 dB as the power ratio of the signal channel DPCCH (control) and DPDCH (data). When the transmission rate increases to 64 kbps and 144 kbps, the β ratio changes to βc:βd=5:15, and βc:βd=4:15. The power ratio also changes to −9.54 dB and −11.48 dB. The power of the data signal is increased relative to the power of the control signal. In the HS mode, HS-DPCCH is added to DPCCH and DPDCH. Hence, βHS as the β ratio of HS-DPCCH is determined by βHS=βc× 10a (a=(Δ (HS-DPCCH)÷20)) in which ΔHS-DPCCH is called a power offset and changes depending on data contents transmitted by HS-DPCCH. The data of HS-DPCCH transmitted to the base station contains an ACK signal if the received data is correctly decoded, or an NACK signal serving as a retransmission request or a CQI (Channel Quality Indicator) signal representing the situation of the transmission channel if the data is not correctly decoded. The power offset value changes to Δ HS-DPCCH=0.33 to 2.00 in accordance with the ACK signal, NACK signal, or CQI signal data. For example, when the ACK signal is transmitted as an HS- DPCCH signal at a transmission rate of 12.2 kbps (ΔHS-DPCCH=0.53), the β ratio given by βc:βd:βHS=8:15:4.27. The β ratio is determined by a digital signal processing device 1100 in accordance with a base station instruction, and the transmission rate, normal mode, or HS mode based on the instruction.

For example, as β ratio combinations, a mode in which βd=0, βc=15, and βH=15 (to be referred to as "HS mode 1" hereinafter) and a mode in which βd=14, βc=15, and βHS=1 (to be referred to as "HS mode 2" hereinafter) can be defined. For example, in the HS mode 1, PAR is about 5.2 dB. In the HS mode 2, PAR is about 4.7 dB. Hence, the battery voltage threshold value to switch the voltage source to the power amplifier 1330 from the DC/DC converter 1520 to the battery 1600 must also be changed between the HS mode 1 and the HS mode 2.

Figures 8, 9:
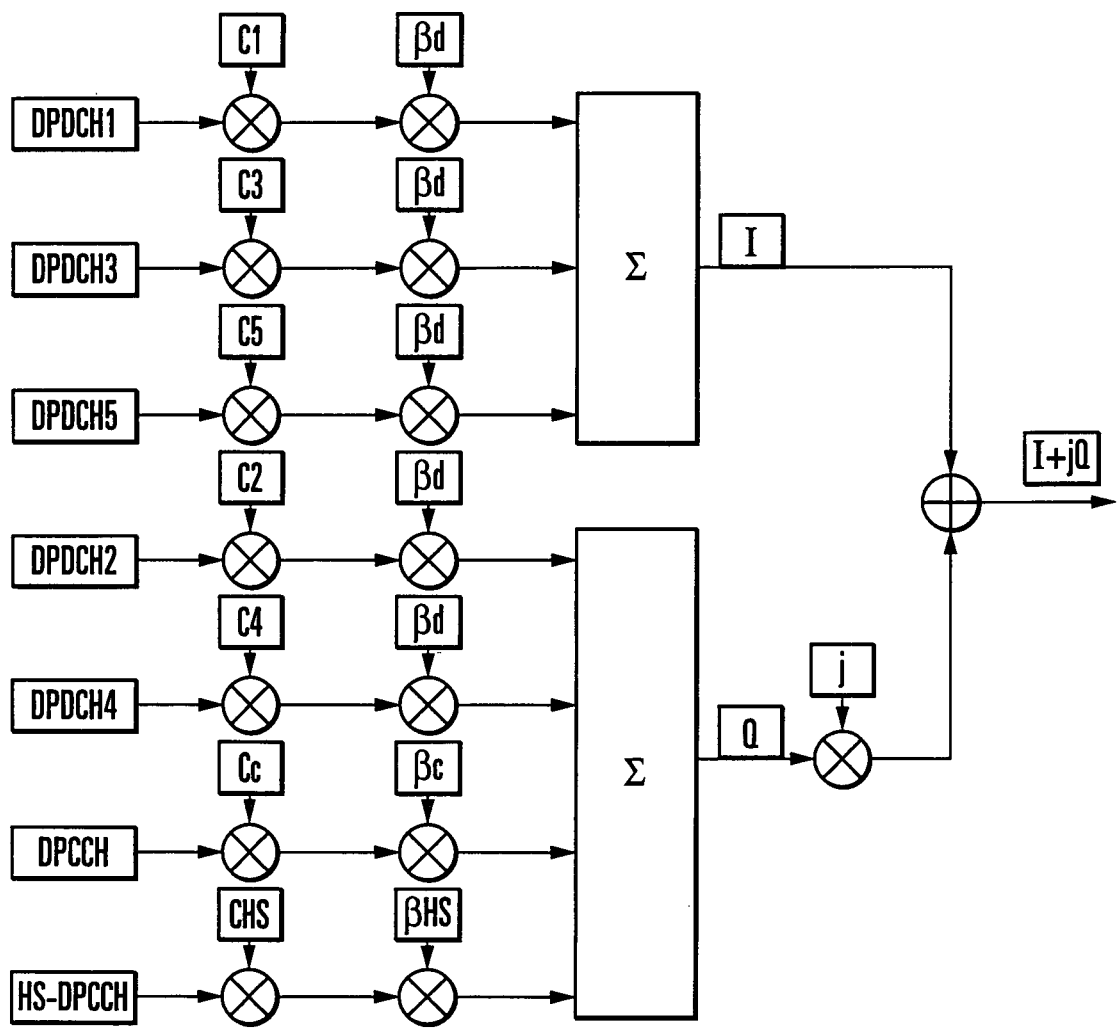
FIG. 8 is a view showing a method of multiplexing data signals DPDCH1 to DPDCH5, a control signal DPCCH, and an HS mode control signal HS-DPCCH.
FIG. 9 is a view showing an example of the internal arrangement of a memory device according to the second embodiment of the present invention.

FIG. 8 shows a method of multiplexing data signals DPDCH1 to DPDCH5, the control signal DPCCH, and the HS mode control signal HS-DPCCH.

C1 to C5, Cc, and CHS are called channelization codes. When these codes are applied to signals and applied again at the time of decoding, the signals can be separated for each channel. Additionally, βd, βc, and βHS are called β ratios. As the β ratio becomes higher in level adjustment of each signal, the level of the signal becomes high. Furthermore, j indicates rotating the phase by 90°. Hence, the I signal and Q signal after multiplexing have different phases.

FIG. 9 shows an example of the internal arrangement of a memory device 1400 according to this embodiment.

The memory device 1400 stores battery voltage threshold values to switch the voltage source from the DC/DC converter 1520 to the battery 1600 in correspondence with the HS mode 1, HS mode 2, and normal mode. The voltage threshold value is 3.9 V in the HS mode 1, 3.8 V in the HS mode 2, and 3.6 V in the normal mode.

Figure 10:
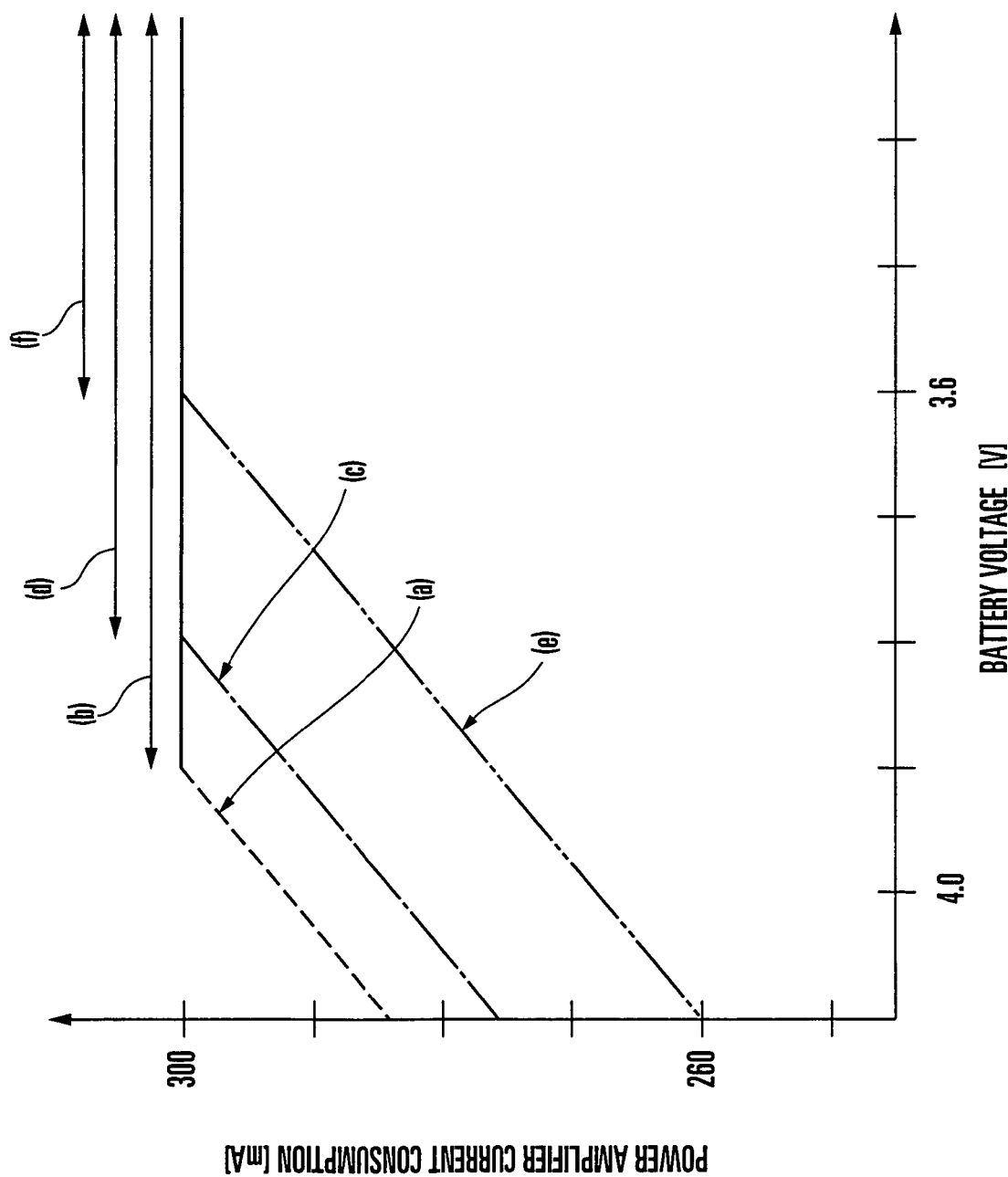
FIG. 10 is a graph showing the relationship between the current consumption of a power amplifier and the voltage of a battery 1600 in the HS mode 1, HS mode 2, and normal mode.

FIG. 10 shows the relationship between the current consumption of the power amplifier 1330 and the voltage of the battery 1600 in the HS mode 1, HS mode 2, and normal mode. In this example, the transmission power is 24 dBm. Referring to FIG. 10, (a) indicates a case wherein a voltage of 3.9 V is supplied to the power amplifier 1330 through the DC/DC converter 1520 in the HS mode 1, (b) indicates a case wherein a voltage is supplied from the battery 1600 in the HS mode 1, (c) indicates a case wherein a voltage of 3.8 V is supplied to the power amplifier 1330 through the DC/DC converter 1520 in the HS mode 2, (d) indicates a case wherein a voltage is supplied from the battery 1600 in the HS mode 2, (e) indicates a case wherein a voltage of 3.6 V is supplied through the DC/DC converter 1520 in the normal mode, and (f) indicates a case wherein a voltage is supplied from the battery 1600 in the normal mode.

As described above, the PAR value changes between the HS mode 1, the HS mode 2, and the normal mode. The optimum voltage to be supplied to the power amplifier 1330, i.e., the voltage not to degrade the RF characteristic becomes higher in the order of the HS mode 1, HS mode 2, and normal mode. For this reason, the current consumption also increases in the order of the HS mode 1, HS mode 2, and normal mode. In this example, the voltage supplied from the DC/DC converter 1520 to the power amplifier 1330 is 3.9 V in the HS mode 1, 3.8 V in the HS mode 2, and 3.6 V in the normal mode.

When the voltage of the battery 1600 is high, the current consumption of the power amplifier 1330 can be reduced by supplying the voltage to the power amplifier 1330 through the DC/DC converter 1520. However, as the voltage of the battery 1600 drops, the current consumption of the power amplifier 1330 increases if the voltage is supplied to the power amplifier 1330 through the DC/DC converter 1520. To prevent degradation in RF characteristic, the voltage source to the power amplifier 1330 needs to be switched from the DC/DC converter 1520 to the battery 1600 in accordance with the voltage of the battery 1600. A voltage which increases in the order of the HS mode 1, HS mode 2, and normal mode must be supplied to the power amplifier 1330. Hence, the threshold voltage to switch the voltage source to the power amplifier 1330 from the DC/DC converter 1520 to the battery 1600 also becomes higher in the order of the HS mode 1, HS mode 2, and normal mode. The threshold value to switch the voltage source to the power amplifier 1330 can be set to, e.g., 3.9 V in the HS mode 1, 3.8 V in the HS mode 2, and 3.6 V in the normal mode.

Figure 11:
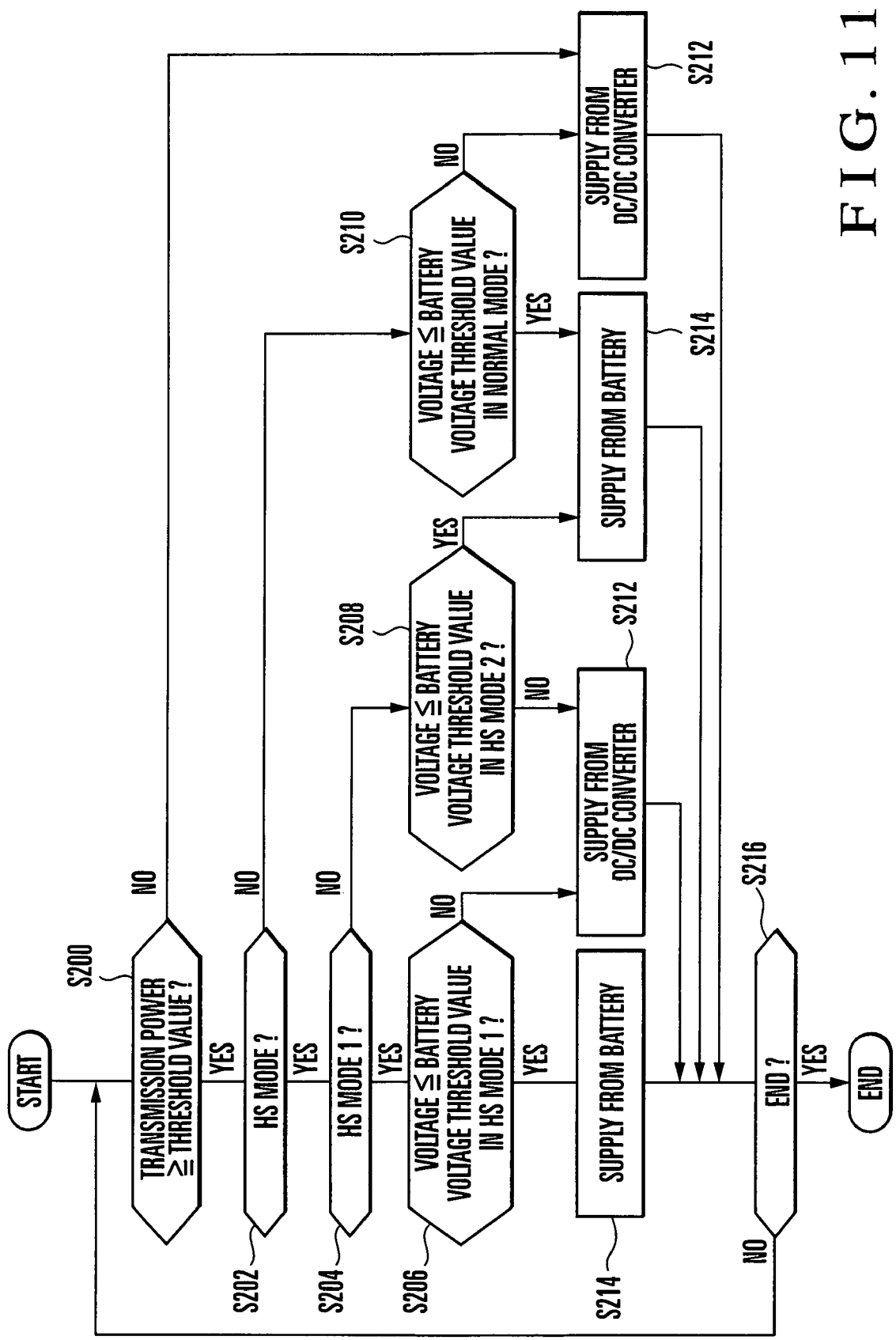
FIG. 11 is a flowchart showing control procedures for causing a power source switching control device to switch the voltage source to the power amplifier.

FIG. 11 shows control procedures for causing a power source switching control device 1530 to switch the voltage source to the power amplifier 1330.

The digital signal processing device 1100 notifies the power source switching control device 1530 whether the mode is the HS mode 1, HS mode 2, or normal mode and whether the transmission power is equal to or more than the threshold value. In this embodiment, a CPU device 1000 notifies the power source switching control device 1530 whether the voltage of the battery 1600 is equal to or more than the threshold value in the HS mode 1, whether the voltage of the battery 1600 is equal to or more than the threshold value in the HS mode 2, or whether the voltage of the battery 1600 is equal to or more than the threshold value in the normal mode.

First, the power source switching control device 1530 determines on the basis of the notification from the digital signal processing device 1100 whether the transmission power is equal to or more than the threshold value (S200). If the transmission power is not equal to or more than the threshold value (NO in step S200), the voltage source to the power amplifier 1330 is switched to the DC/DC converter 1520 (S212).

If the transmission power is equal to or more than the threshold value in step S200 (YES in step S200), the power source switching control device 1530 determines on the basis of the notification from the digital signal processing device 1100 whether the mode is the HS mode or normal mode (S202). If the mode is the HS mode (YES in step S202), the power source switching control device 1530 determines on the basis of the notification from the digital signal processing device 1100 whether the mode is the HS mode 1 (S204). If the mode is the HS mode 1 (YES in step S204), the power source switching control device 1530 determines on the basis of the notification from the CPU device 1000 whether the voltage of the battery 1600 is equal to or less than the battery voltage threshold value in the HS mode 1 (S206). If the voltage of the battery 1600 is not equal to or less than the battery voltage threshold value in the HS mode 1 (NO in step S206), the voltage source to the power amplifier 1330 is set to the DC/DC converter 1520 (S212). If the voltage of the battery 1600 is equal to or less than the battery voltage threshold value in the HS mode 1 in step S206 (YES in step S206), the voltage source to the power amplifier 1330 is set to the battery 1600 (S214).

If the mode is not the HS mode 1 in step S204 (NO in step S204), the power source switching control device 1530 determines on the basis of the notification from the CPU device 1000 whether the voltage of the battery 1600 is equal to or less than the battery voltage threshold value in the HS mode 2 (S208). If the voltage of the battery 1600 is not equal to or less than the battery voltage threshold value in the HS mode 2 (NO in step S208), the voltage source to the power amplifier 1330 is set to the DC/DC converter 1520 (S212). If the voltage of the battery 1600 is equal to or less than the battery voltage threshold value in the HS mode 2 in step S208 (YES in step S208), the voltage source to the power amplifier 1330 is set to the battery 1600 (S214).

If the mode is not the HS mode (NO in step S202), the power source switching control device 1530 determines on the basis of the notification from the CPU device 1000 whether the voltage of the battery 1600 is equal to or less than the battery voltage threshold value in the normal mode (S210). If the voltage of the battery 1600 is not equal to or less than the battery voltage threshold value in the normal mode (NO in step S210), the voltage source to the power amplifier 1330 is set to the DC/DC converter 1520 (S212). If the voltage of the battery 1600 is equal to or less than the battery voltage threshold value in the normal mode in step S210 (YES in step S210), the voltage source to the power amplifier 1330 is set to the battery 1600 (S214).

After the above-described processing, it is determined whether to end the processing (S216). If the processing is not to be ended (NO in step S216), the flow returns to step S200 to repeat the same processing. If the processing should be ended in step S216 (YES in step S216), the processing is ended.

(b) PAR Value

In the above-described example, the mode is changed depending on the β ratio combination. The mode may be changed depending on the difference in PAR value. For example, PAR=(5±0.5) dB may be defined as a mode 1, and PAR=(3±0.5) dB may be defined as a mode 2. After the mode is classified into the normal mode and HS mode, the HS mode may be subdivided into the mode 1 and mode 2, as described above.

(c) ACLR Value

The mode may be selected depending on the difference in ACLR value. For example, ACLR≧38 dBc may be defined as a mode 1, and ACLR<38 dBc may be defined as a mode 2. After the mode is classified into the normal mode and HS mode, the HS mode may be subdivided into the mode 1 and mode 2, as described above.

The ACLR value also changes depending on the β ratio combination. For example, when βc:βd:βHS=5:15:10, ACLR=39 dBc so that the mode 1 can be set. When βc:βd:βHS=15:15:24, ACLR=37 dBc so that the mode 2 can be set.

The ACLR value also depends on the components of the RF device 1300, such as the power amplifier 1330 and an RFIC 1350. Hence, when the mode is changed depending on the difference in ACLR value, the degradation in RF characteristic can be suppressed more accurately.

Figures 12, 13:
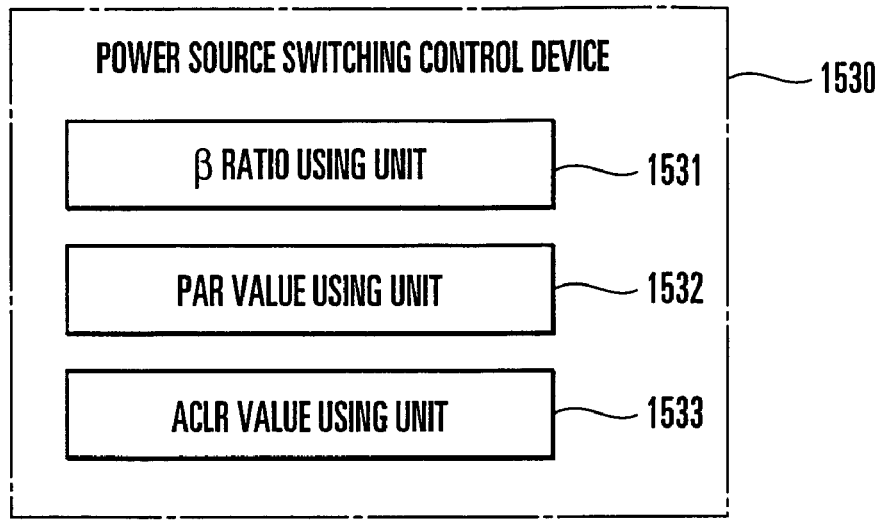
FIG. 12 is a view showing an example of the internal arrangement of the power source switching control device.
FIG. 13 is a view showing an example of the internal arrangement of a memory device according to the third embodiment of the present invention.

FIG. 12 shows an example of the internal arrangement of the power source switching control device 1530 according to this embodiment.

The power source switching control device 1530 includes a β ratio using unit 1531 which uses a voltage threshold value that changes for each of a plurality of transmission modes classified in accordance with the assumed value of the β ratio, a PAR value using unit 1532 which uses a voltage threshold value that changes for each of a plurality of transmission modes classified in accordance with the assumed value of PAR in the power amplifier 1330, and an ACLR value using unit 1533 which uses a voltage threshold value that changes for each of a plurality of transmission modes classified in accordance with the assumed value of ACLR.

Even in the cellular phone terminal 100 of this embodiment, the same effect as in the first embodiment can be obtained. In addition, the modes can be subdivided by, e.g., classification based on β ratio combinations, classification based on PAR values, or classification based on ACLR values. Hence, suppression of degradation in RF characteristic and reduction of current consumption can be implemented more effectively.

Third Embodiment

The third embodiment is different from the first and second embodiments in that the threshold value of transmission power in switching control of the voltage source to a power amplifier 1330 also changes in accordance with the mode. A cellular phone terminal 100 of this embodiment has the same constituent elements as in the first embodiment.

When the modes are classified in the manner described in the first and second embodiments, the relationship between the RF characteristic and the transmission power may change depending on the mode. In some modes, even when the transmission power is high, the voltage of a battery 1600 is low, and the low voltage is supplied to the power amplifier 1330 through a DC/DC converter 1520, the RF characteristic does not degrade. In this case, the current consumption can be reduced by supplying the voltage through the DC/DC converter 1520 rather than from the battery 1600.

In this embodiment, a memory device 1400 stores the transmission power threshold value for each of, e.g., a HS mode 1, HS mode 2, and normal mode.

FIG. 13 shows an example of the internal arrangement of the memory device 1400 according to this embodiment.

The memory device 1400 stores battery voltage threshold values to switch the voltage source from the DC/DC converter 1520 to the battery 1600 and transmission power threshold values in correspondence with the HS mode 1, HS mode 2, and normal mode. The transmission power threshold value is 20 dBm in the HS mode 1, 21 dBm in the HS mode 2, and 21 dBm in the normal mode. The voltage threshold value of each mode is the same as in the example shown in FIG. 9.

Figure 14:
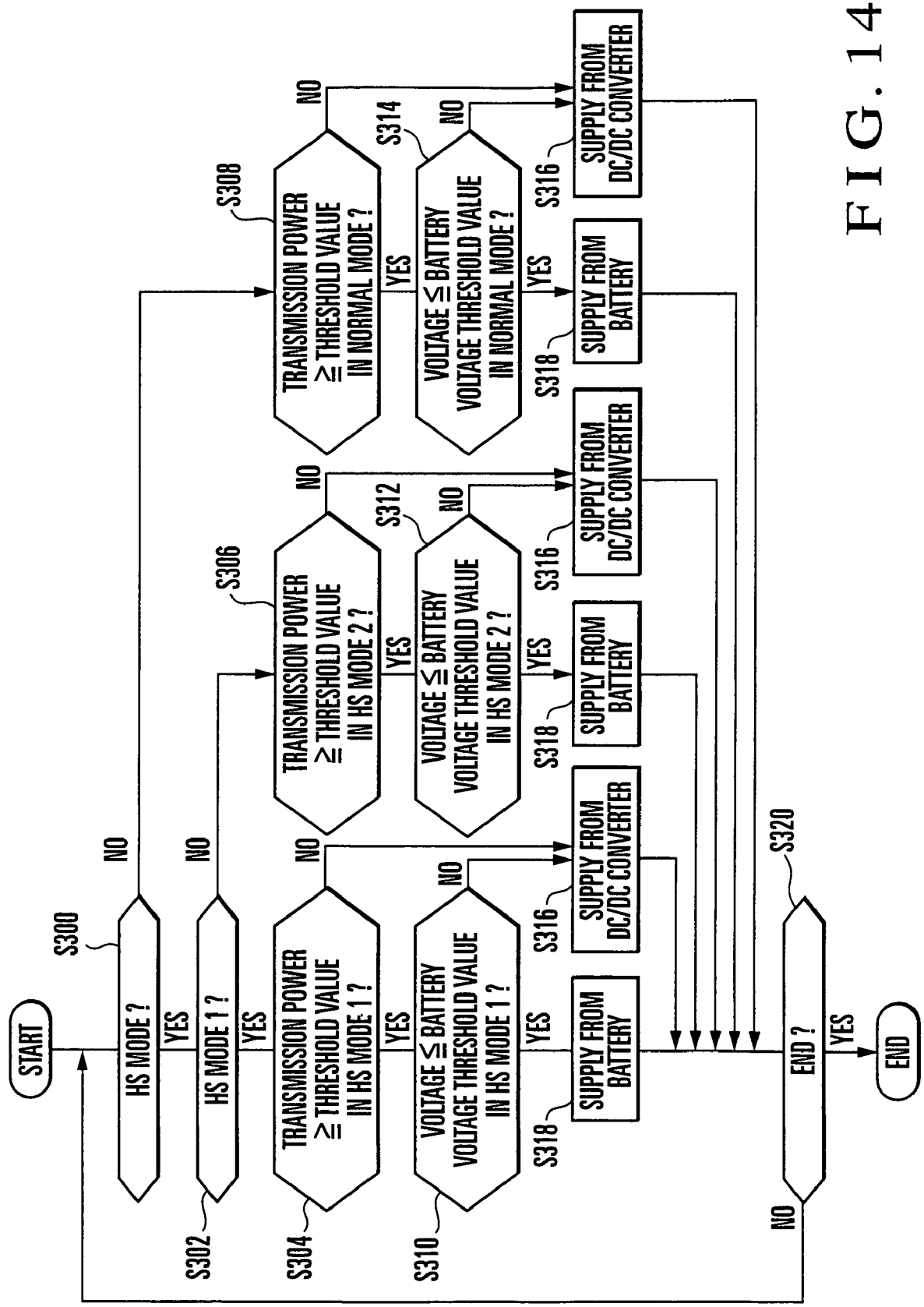
FIG. 14 is a flowchart showing control procedures for causing a power source switching control device to switch the voltage source to a power amplifier.

FIG. 14 shows control procedures for causing a power source switching control device 1530 to switch the voltage source to the power amplifier 1330.

A digital signal processing device 1100 notifies the power source switching control device 1530 whether the mode is the HS mode 1, HS mode 2, or normal mode and whether the transmission power is equal to or more than the threshold value in each mode. In this embodiment, a CPU device 1000 notifies the power source switching control device 1530 whether the voltage of the battery 1600 is equal to or more than the threshold value in the HS mode 1, whether the voltage of the battery 1600 is equal to or more than the threshold value in the HS mode 2, or whether the voltage of the battery 1600 is equal to or more than the threshold value in the normal mode.

First, the power source switching control device 1530 determines on the basis of the notification from the digital signal processing device 1100 whether the mode is the HS mode (S300). If the mode is the HS mode (YES in step S300), the power source switching control device 1530 determines on the basis of the notification from the digital signal processing device 1100 whether the mode is the HS mode 1 (S302). If the mode is the HS mode 1 (YES in step S302), the power source switching control device 1530 determines on the basis of the notification from the digital signal processing device 1100 whether the transmission power is equal to or more than the threshold value in the HS mode 1 (S304).

If the transmission power is equal to or more than the threshold value in the HS mode 1 (YES in step S304), the power source switching control device 1530 determines on the basis of the notification from the CPU device 1000 whether the voltage of the battery 1600 is equal to or less than the battery voltage threshold value in the HS mode 1 (S310). If the voltage of the battery 1600 is equal to or less than the battery voltage threshold value in the HS mode 1 (YES in step S310), the voltage source to the power amplifier 1330 is set to the battery 1600 (S318).

If the transmission power is not equal to or more than the threshold value in the HS mode 1 in step S304 (NO in step S304), and the voltage of the battery 1600 is not equal to or less than the battery voltage threshold value in the HS mode 1 in step S310 (NO in step S310), the voltage source to the power amplifier 1330 is set to the DC/DC converter 1520 (S316).

If the mode is not the HS mode 1 in step S302 (NO in step S302), the power source switching control device 1530 determines on the basis of the notification from the digital signal processing device 1100 whether the transmission power is equal to or more than the threshold value in the HS mode 2 (S306). If the transmission power is equal to or more than the threshold value in the HS mode 2 (YES in step S306), the power source switching control device 1530 determines on the basis of the notification from the CPU device 1000 whether the voltage of the battery 1600 is equal to or less than the battery voltage threshold value in the HS mode 2 (S312). If the voltage of the battery 1600 is equal to or less than the battery voltage threshold value in the HS mode 2 (YES in step S312), the voltage source to the power amplifier 1330 is set to the battery 1600 (S318).

If the transmission power is not equal to or more than the threshold value in the HS mode 2 in step S306 (NO in step S306), and the voltage of the battery 1600 is not equal to or less than the battery voltage threshold value in the HS mode 2 in step S312 (NO in step S312), the voltage source to the power amplifier 1330 is set to the DC/DC converter 1520 (S316).

If the mode is not the HS mode in step S300 (NO in step S300), the power source switching control device 1530 determines on the basis of the notification from the digital signal processing device 1100 whether the transmission power is equal to or more than the threshold value in the normal mode (S308). If the transmission power is equal to or more than the threshold value in the normal mode (YES in step S308), the power source switching control device 1530 determines on the basis of the notification from the CPU device 1000 whether the voltage of the battery 1600 is equal to or less than the battery voltage threshold value in the normal mode (S314). If the voltage of the battery 1600 is equal to or less than the battery voltage threshold value in the normal mode (YES in step S314), the voltage source to the power amplifier 1330 is set to the battery 1600 (S318).

If the transmission power is not equal to or more than the threshold value in the normal mode in step S308 (NO in step S308), and the voltage of the battery 1600 is not equal to or less than the battery voltage threshold value in the normal mode in step S314 (NO in step S314), the voltage source to the power amplifier 1330 is set to the DC/DC converter 1520 (S316).

After steps S316 and S318, it is determined whether to end the processing (S320). If the processing is not to be ended (NO in step S320), the flow returns to step S300 to repeat the same processing.

FIG. 15 shows an example of the internal arrangement of the power source switching control device 1530 according to this embodiment.

The power source switching control device 1530 comprises a mode determination unit 1534 which determines the transmission mode, a transmission power determination unit 1535 which determines whether the transmission power of a transmission signal is equal to or more than the threshold value, a battery voltage determination unit 1536 which determines whether the voltage of the battery 1600 is equal to or more than the threshold value, and a switching unit 1537 which switches the voltage source to the power amplifier 1330 on the basis of the determination results from the determination units 1534 to 1536. The mode determination unit 1534 executes the operation in steps S300 and S302. The transmission power determination unit 1535 executes the operation in steps S304, S306, and S308. The battery voltage determination unit 1536 executes the operation in steps S310, S312, and S314. The switching unit 1537 executes the operation in steps S316 and S318.

Even in the cellular phone terminal 100 of this embodiment, the same effect as in the first and second embodiments can be obtained. According to the cellular phone terminal 100 of this embodiment, the transmission power threshold value to switch the voltage source to the power amplifier 1330 from the DC/DC converter 1520 to the battery 1600 or from the battery 1600 to the DC/DC converter 1520 can be set for each mode. Hence, suppression of degradation in RF characteristic and reduction of current consumption can be implemented more effectively.

Fourth Embodiment

The fourth embodiment is different from the first to third embodiments in that the power ON/OFF timing of a DC/DC converter 1520 is controlled. A cellular phone terminal 100 of this embodiment has the same constituent elements as in the first embodiment.

If the power of DC/DC converter 1520 which is not being used is kept ON, current consumption increases. To reduce the current consumption, the power of the DC/DC converter 1520 is preferably turned off when it is not used.

However, the DC/DC converter 1520 takes rise and fall times at power-ON/OFF. This is because a switching power supply is generally used, which periodically turns on/off a switch in the DC/DC converter 1520 and changes the voltage value by using the characteristic of a coil, capacitor, or diode. For this reason, if the DC/DC converter 1520 is frequently turned on/off in mode switching, the rise/fall timing control is difficult. The voltage supplied to a power amplifier 1330 transiently varies, resulting in a variation in transmission power.

FIG. 16 shows the rise and fall characteristic of the DC/DC converter 1520. A rise time $T_1$ of the DC/DC converter 1520 from 0 V at power ON timing $t_1$ to 3.5 V is 30 to 100 µs or more. A fall time $T_2$ from 3.5 V at power OFF timing $t_2$ to 0 V is 100 to 1,000 µs or more.

Figure 17:
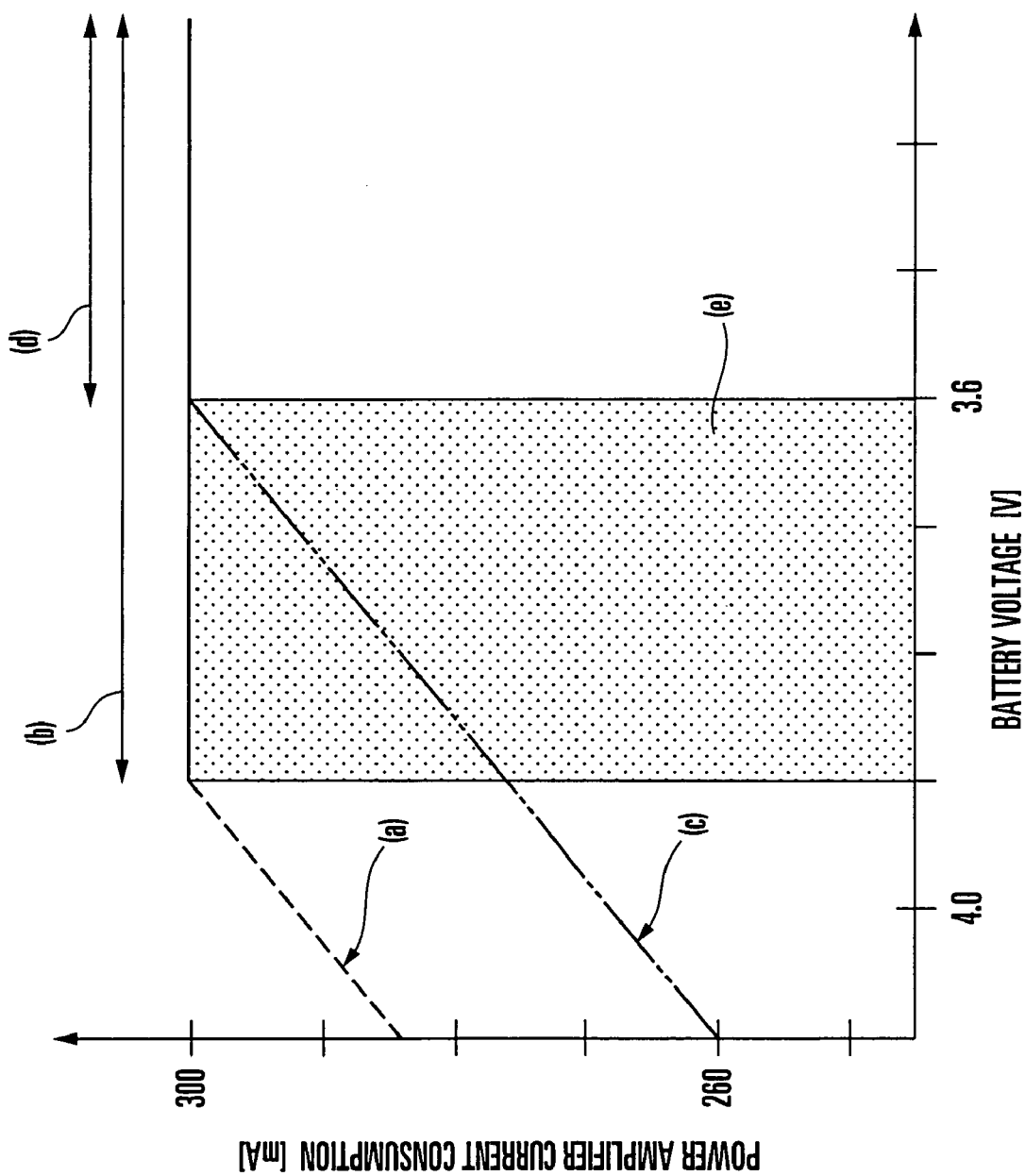
FIG. 17 is a graph showing a region where the voltage source to the power amplifier is switched from the battery 1600 to the DC/DC converter or conversely from the DC/DC converter to the battery 1600 because of mode switching.

FIG. 17 shows a region where the voltage source to the power amplifier 1330 is switched from a battery 1600 to the DC/DC converter 1520 or conversely from the DC/DC converter 1520 to the battery 1600 because of mode switching. In this example, the transmission power is 24 dBm. Referring to FIG. 17, (a) indicates a case wherein a voltage of 3.9 V is supplied to the power amplifier 1330 through the DC/DC converter 1520 in the HS mode, (b) indicates a case wherein a voltage is supplied from the battery 1600 in the HS mode, (c) indicates a case wherein a voltage of 3.6 V is supplied through the DC/DC converter 1520 in the normal mode, and (d) indicates a case wherein a voltage is supplied from the battery 1600 in the normal mode. In addition, (e) indicates a region whether the voltage source is switched between the battery 1600 and the DC/DC converter 1520 by switching between the HS mode and the normal mode.

In this example, a voltage of 3.9 V is supplied to the power amplifier 1330 through the DC/DC converter 1520 in the HS mode. In the normal mode, a voltage of 3.6 V is supplied. In this case, the threshold value to switch the voltage source to the power amplifier 1330 can be set to, e.g., 3.9 V in the HS mode and 3.6 V in the normal mode, as described in the first embodiment with reference to FIG. 7.

When the voltage of the battery 1600 is between 3.6 V and 3.9 V, the voltage source to the power amplifier 1330 is the battery 1600 in the HS mode and the DC/DC converter 1520 in the normal mode. Whether the mode is the HS mode or normal mode is changed as needed in accordance with the type of data transmitted by the cellular phone terminal 100. For this reason, when the voltage of the battery 1600 falls within this range, even if the mode temporarily changes to the HS mode to supply the voltage from the battery 1600 to the power amplifier 1330 without intervention of the DC/DC converter 1520, the mode must immediately be returned to the normal mode to supply the voltage to the power amplifier 1330 through the DC/DC converter 1520.

Figure 18:
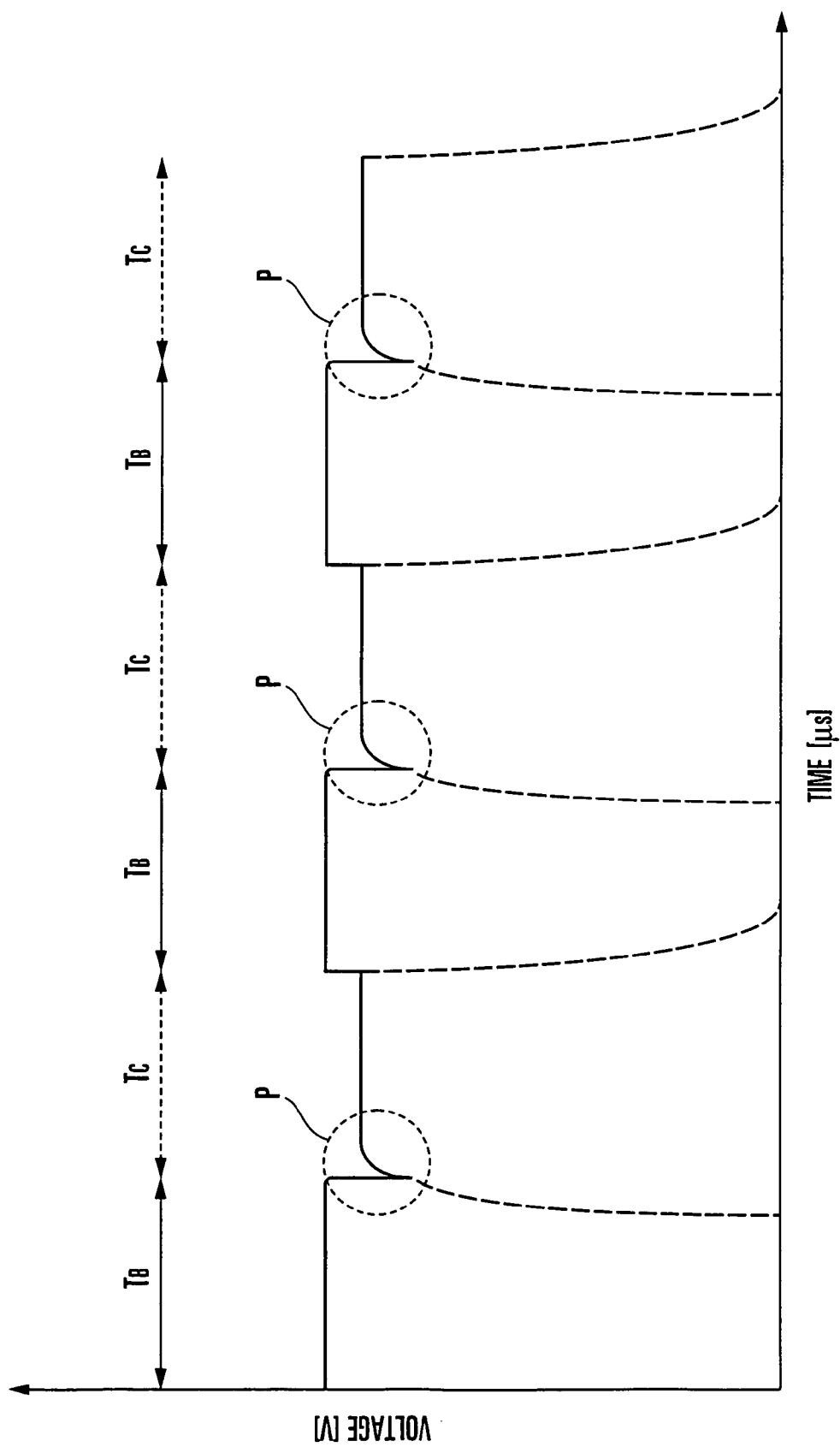
FIG. 18 is a graph showing the voltage supplied to the power amplifier when the voltage source to the power amplifier is switched from the battery 1600 to the DC/DC converter or conversely from the DC/DC converter to the battery 1600 because of mode switching.

FIG. 18 shows the voltage supplied to the power amplifier 1330 when the voltage source to the power amplifier 1330 is switched from the battery 1600 to the DC/DC converter 1520 or conversely from the DC/DC converter 1520 to the battery 1600 because of mode switching. Referring to FIG. 18, $T_B$ represents a period to supply the voltage from the battery 1600 in the HS mode, $T_C$ represents a period to supply the voltage through the DC/DC converter 1520 in the normal mode, and P indicates a point where switching fails.

When the voltage of the battery 1600 is equal to or less than the voltage threshold value in the HS mode and more than the voltage threshold value in the normal mode, and the mode is switched during signal transmission, the voltage source to the power amplifier 1330 changes between the battery 1600 and the DC/DC converter 1520 as needed. At this time, if the DC/DC converter 1520 is not always ON, a time is required after the DC/DC converter 1520 is turned on until a constant voltage is supplied from the DC/DC converter 1520, and switching fails.

Figure 19:
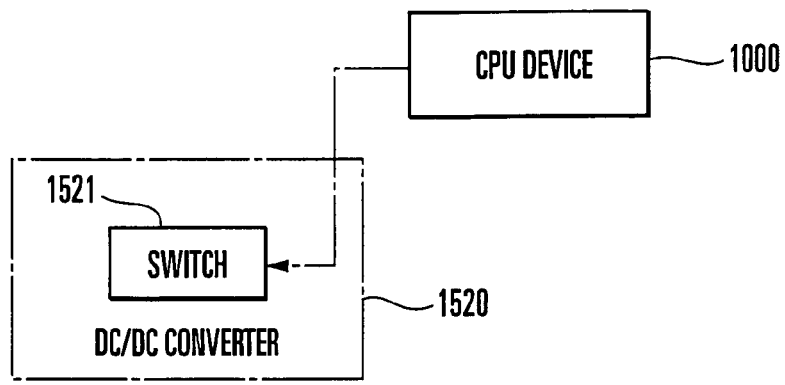
FIG. 19 is a block diagram showing the arrangement of the main part of a DC/DC converter according to the fourth embodiment of the present invention.

FIG. 19 shows the arrangement of the main part of the DC/DC converter 1520 according to this embodiment.

The DC/DC converter 1520 has a switch 1521. The switch 1521 turns on/off the DC/DC converter 1520 in accordance with a control signal from a CPU device 1000. The CPU device 1000 gives, to the switch 1521, a control signal which turns on the DC/DC converter 1520 when the voltage of the battery 1600 is equal to or more than the voltage threshold value in any one of the transmission modes or off when the voltage of the battery 1600 is less than the voltage threshold values in all transmission modes.

Figure 20:
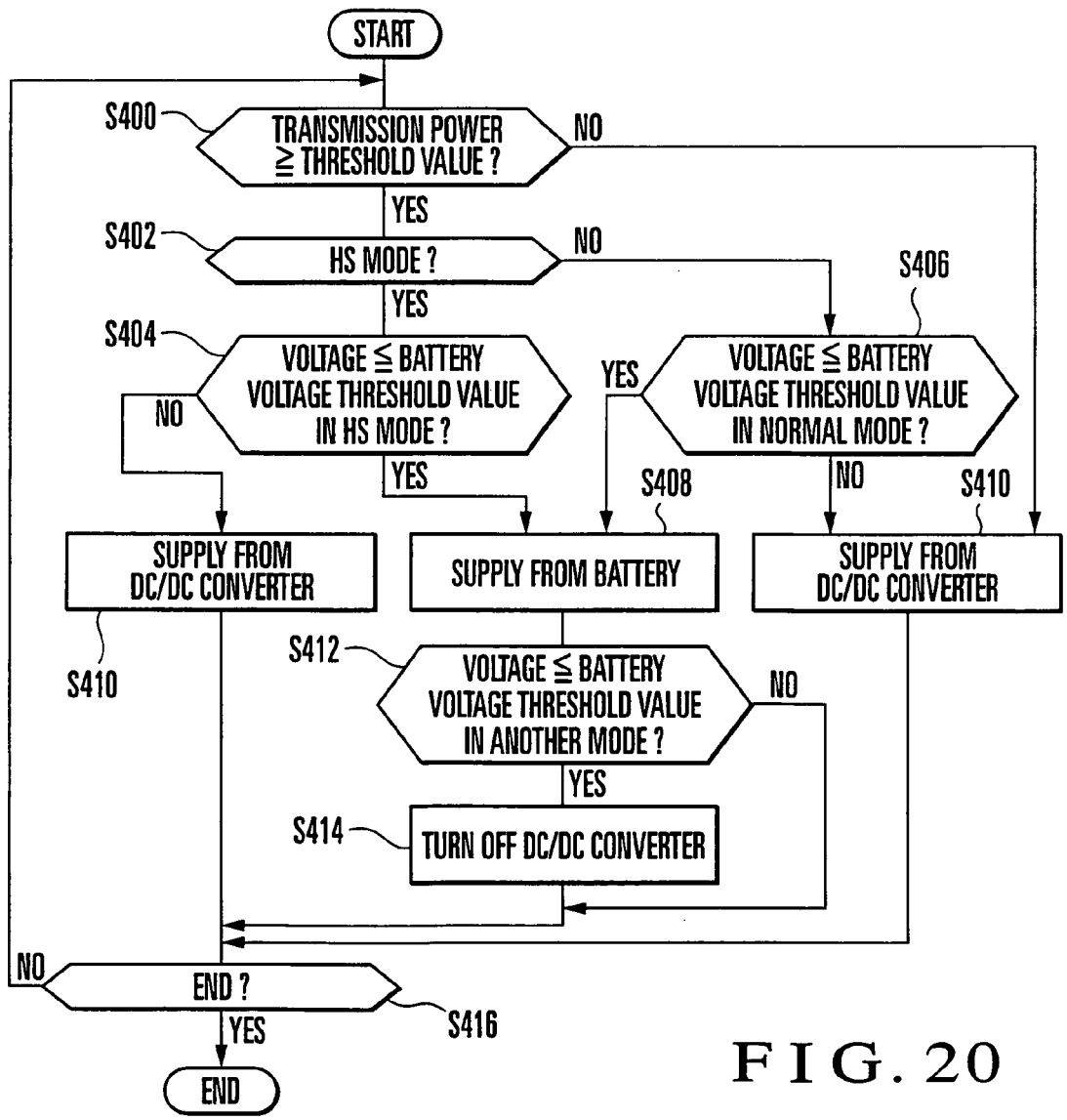
FIG. 20 is a flowchart showing control procedures for switching the voltage source to a power amplifier and control procedures for turning on/off the switch of the DC/DC converter in a cellular phone terminal.

FIG. 20 shows control procedures for switching the voltage source to the power amplifier 1330 and control procedures for turning on/off the switch 1521 of the DC/DC converter 1520 in the cellular phone terminal 100. This will be described below also with reference to FIGS. 1 to 5.

Processing in steps S400 to S410 is the same as in steps S100 to S110 in FIG. 6 of the first embodiment, and a description thereof will be omitted.

After step S408, the CPU device 1000 determines whether the voltage of the battery 1600 is equal to or less than the threshold value in another mode (S412). If the voltage of the battery 1600 is equal to or less than the battery voltage threshold value in another mode (YES in S412), a notification to turn off the DC/DC converter 1520 is output. Hence, the DC/DC converter 1520 is turned off (S414). If the voltage of the battery 1600 is not equal to or less than the battery voltage threshold value in another mode (NO in S412), the flow advances to step S416 without turning off the DC/DC converter 1520.

For example, when the voltage of the battery 1600 drops to 3.9 V or less in the HS mode (YES in step S402), the voltage of the battery 1600 is equal to or less than the battery voltage threshold value in the HS mode (YES in step S404). Hence, the voltage source to the power amplifier 1330 is set to the battery 1600 (S408). If the voltage of the battery 1600 is, e.g., 3.7 V, it is not equal to or less than the battery voltage threshold value in the normal mode (NO in step S412). Hence, the flow advances to step S416 without turning off the DC/DC converter 1520.

On the other hand, when the voltage of the battery 1600 drops to 3.6 V or less, it is equal to or less than the battery voltage threshold value in both the HS mode and the normal mode (YES in step S412). Hence, the DC/DC converter 1520 is turned off (S414).

Even in the cellular phone terminal 100 of this embodiment, the same effect as in the first and second embodiments can be obtained. In addition, while the voltage of the battery 1600 is equal to or more than the voltage threshold value in any one of the modes, the DC/DC converter 1520 is kept on. Hence, when the voltage source to the power amplifier 1330 switches because of mode switching, smooth switching can be done, and a stable voltage can be supplied to the power amplifier 1330.

The present invention has been described above on the basis of the embodiments. The embodiments are merely examples. Those skilled in the art can readily understand that various modifications of the combination of constituent elements or processes can be made, and the modifications are also incorporated in the present invention.

The constituent elements of the cellular phone terminal 100 are implemented by the CPU of an arbitrary computer, a memory, a program which is loaded in the memory to implement the constituent elements shown in the drawings, a storage unit such as a hard disk to store the program, and an arbitrary combination of hardware and software via a network connection interface. Those skilled in the art can readily understand that there are various modifications of the implementation method and apparatus. The drawings described in the embodiments indicate no hardware components but functional blocks. For example, the power source switching control device 1530 is included in the power supply device 1500 in FIG. 4. However, the power source switching control device 1530 may be included in another block of the cellular phone terminal 100.

As described above, the voltage supply control device of the present invention comprises the DC/DC converter 1520 which receives a voltage from the battery 1600 and generates a desired voltage, and the power source switching control device 1530 which executes switching so as to supply the voltage to the power amplifier 1330 to amplify a transmission signal through the DC/DC converter 1520 when the voltage of the battery 1600 is equal to or more than a predetermined threshold value or supply the voltage to the power amplifier 1330 from the battery 1600 without intervention of the DC/DC converter 1520 when the voltage of the battery 1600 is less than the predetermined threshold value. The power source switching control device 1530 uses different voltage threshold values for a plurality of transmission modes classified in accordance with the assumed values of appropriate voltages to be supplied to the power amplifier 1330.

When the voltage of the battery 1600 is equal to or more than a predetermined threshold value, the battery voltage is decreased to an optimum voltage by the DC/DC converter 1520 and then supplied to the power amplifier 1330. A signal can be amplified by the power amplifier 1330 without any distortion. Hence, the current consumption can be reduced. When the voltage of the battery 1600 is less than the predetermined threshold value, the current consumption of the DC/DC converter 1520 increases, or the efficiency of the DC/DC converter 1520 decreases. Since no sufficient voltage required by the power amplifier 1330 can be supplied, it is difficult for the power amplifier 1330 to amplify a signal without distortion, and the RF characteristic degrades greatly. To prevent this, when the voltage of the battery 1600 is less than the predetermined threshold value, voltage supply through the DC/DC converter 1520 is stopped. When the voltage is supplied directly from the battery 1600 to the power amplifier 1330, the sufficient voltage required by the power amplifier 1330 can be supplied, and the degradation in RF characteristic can be avoided.

The assumed value of the appropriate voltage to be supplied to the power amplifier 1330 sometimes changes depending on the type of the signal to be amplified by the power amplifier 1330. For example, the assumed value of the appropriate voltage to be supplied to the power amplifier 1330 changes between a case wherein the voltage supply control device of the present invention is used in a cellular phone terminal compatible with HSDPA, a case wherein a signal for HSDPA is to be transmitted (to be referred to as an HS mode hereinafter), and any other case (to be referred to as a normal mode hereinafter). In this case, when the battery voltage threshold value to switch the voltage source is small, the current consumption reduction effect can be obtained in transmitting a signal in the normal mode. In transmitting a signal in the HS mode, however, the RF characteristic may degrade. When the battery voltage threshold value to switch the voltage source is large, the degradation in RF characteristic can be suppressed in transmitting a signal in the HS mode. In transmitting a signal in the normal mode, however, the current consumption may increase.

According to the voltage supply control device of the present invention, the battery voltage threshold value to switch the voltage source is changed between the plurality of transmission modes classified in accordance with the assumed value of the appropriate voltage to be supplied to the power amplifier 1330. Since an appropriate threshold value can be set for each mode, the degradation in RF characteristic can be suppressed, and simultaneously, the current consumption can be reduced.

In the voltage supply control device of the present invention, the plurality of transmission modes can be classified in accordance with the assumed value of PAR in the power amplifier 1330. The power source switching control device 1530 can use different voltage threshold values for the plurality of transmission modes classified in accordance with the assumed values of PARs in the power amplifier 1330.

When the PAR in the power amplifier 1330 is large, the maximum output power of the power amplifier 1330 must be increased not to distort a signal. When the assumed value of the PAR is large, the supplied voltage must be higher than when the assumed value of the PAR is small. That is, when the assumed value of the PAR is large, the assumed value of the voltage to be supplied to the power amplifier 1330 also becomes large.

The assumed value of PAR in the power amplifier 1330 changes, e.g., between a case wherein a signal for HSDPA is to be transmitted and any other case or when the β ratio combination changes in transmitting a signal for HSDPA.

According to the voltage supply control device of the present invention, the battery voltage threshold value to switch the voltage source is changed between the plurality of transmission modes classified in accordance with the assumed value of PAR in the power amplifier 1330. Since an appropriate threshold value can be set for each mode, the degradation in RF characteristic can be suppressed, and simultaneously, the current consumption can be reduced.

In the voltage supply control device of the present invention, the plurality of transmission modes can be classified in accordance with the assumed value of ACLR. The power source switching control device 1530 can use different voltage threshold values for the plurality of transmission modes classified in accordance with the assumed values of ACLRs.

The assumed value of ACLR changes, e.g., between a case wherein a signal for HSDPA is to be transmitted and any other case or when the β ratio combination changes in transmitting a signal for HSDPA. The ACLR also depends on the components such as the power amplifier 1330. Hence, when the mode is changed in accordance with the difference in ACLR, the degradation in RF characteristic can be suppressed more accurately.

The voltage supply control device of the present invention can further include the memory device 1400 which stores the threshold value of the voltage of the battery 1600. In this case, the power source switching control device 1530 can switch the voltage source to the power amplifier 1330 on the basis of the transmission mode of the transmission signal and the threshold value corresponding to the transmission mode, which is stored in the memory device 1400.

In the voltage supply control device of the present invention, the power source switching control device 1530 switches the voltage source to the power amplifier 1330 between the battery 1600 and the DC/DC converter 1520 also in consideration of whether the transmission power of the transmission signal is equal to or more than a predetermined threshold value. The power source switching control device 1530 can use different transmission power threshold values for the plurality of transmission modes.

With this arrangement, suppression of degradation in RF characteristic and reduction of current consumption can be implemented more effectively.

In the voltage supply control device of the present invention, when the voltage of the battery 1600 is equal to or more than the voltage threshold value in any one of the plurality of modes, the switch of the DC/DC converter 1520 can be turned on even when the voltage of the battery 1600 is smaller than the voltage threshold values in the remaining transmission modes.

Hence, smooth switching can be done when the DC/DC converter 1520 takes a rise time at ON/OFF, and the voltage source is switched from the path through the DC/DC converter 1520 to direct supply from the battery 1600 or vice versa because of mode switching.

As described above, according to the present invention, in transmitting a signal from a cellular phone terminal, current consumption can be suppressed while maintaining a satisfactory RF characteristic.

What is claimed is:

1. A voltage supply control device comprising:
a voltage conversion circuit which receives a voltage from a battery and generates a desired voltage; and
a switching control unit which executes switching so as to:
a) supply a voltage to a power amplification circuit to amplify a transmission signal through said voltage conversion circuit when a transmission power of the transmission signal is less than a threshold value of the transmission power, b) supply the voltage to the power amplification circuit through said voltage conversion circuit when the transmission power of the transmission signal is not less than the threshold value of the transmission power and the voltage of the battery is not less than a predetermined threshold value, and c) supply the voltage to the power amplification circuit from the battery without intervention of said voltage conversion circuit when the transmission power of the transmission signal is not less than the threshold value of the transmission power and the voltage of the battery is less than the predetermined threshold value, wherein said switching control unit using, as the predetermined threshold value, selected one of different voltage threshold values for each of a plurality of transmission modes classified in accordance with assumed values of appropriate voltages to be supplied to the power amplification circuit.

2. A device according to claim 1, wherein said switching control unit comprises a peak-to-average-ratio using unit which uses, as the predetermined threshold value, selected one of different voltage threshold values for each of the plurality of transmission modes classified in accordance with assumed values of peak to average ratios in the power amplification circuit.

3. A device according to claim 1, wherein said switching control unit comprises an adjacent-channel-leakage-power-ratio using unit which uses, as the predetermined threshold value, selected one of different voltage threshold values for each of the plurality of transmission modes classified in accordance with assumed values of adjacent channel leakage power ratios.

4. A device according to claim 1, further comprising a storage unit which stores the threshold value of the voltage of the battery for each of the plurality of transmission modes, wherein said switching control unit switches a voltage source to the power amplification circuit on the basis of a transmission mode of a transmission signal and a threshold value corresponding to the transmission mode, which is stored in said storage unit.

5. A device according to claim 1, wherein said voltage conversion circuit comprises a switch which turns on/off said voltage conversion circuit, said switch being set ON when the voltage of the battery is not less than a threshold value of a voltage in any one of the transmission modes or OFF when the voltage of the battery is less than the threshold values of the voltages in all the transmission modes.

6. A cellular phone terminal comprising:
    a battery;
    an RF device which includes a power amplification circuit to amplify a transmission signal;
    a voltage supply control device which supplies a voltage from said battery to said power amplification circuit;
    a digital signal processing device which notifies said voltage supply control device of a transmission mode;
    a CPU device which notifies said voltage supply control device whether the voltage of said battery is not less than a voltage threshold value in each of a plurality of transmission modes, said CPU device using different voltage threshold values for the plurality of transmission modes classified in accordance with assumed values of appropriate voltages to be supplied to said power amplification circuit; and
    an antenna which transmits the transmission signal from said RF device,
        said voltage supply control device comprising
    a voltage conversion circuit which receives the voltage from said battery and generates a desired voltage, and
    a switching control unit which determines on the basis of information from each of said digital signal processing device and said CPU device whether the voltage of said battery is not less than the voltage threshold value in the transmission mode given by said digital signal processing device and executes switching so as to a) supply the voltage to the power amplification circuit to amplify a transmission signal through said voltage conversion circuit when a transmission power of the transmission signal is less than a threshold value of the transmission power, b) supply the voltage to said power amplification circuit through said voltage conversion circuit when the transmission power of the transmission signal is not less than the threshold value of the transmission power and the voltage of said battery is not less than the threshold value, and c) supply the voltage to the power amplification circuit from said battery without intervention of said voltage conversion circuit when the transmission power of the transmission signal is not less than the transmission power and the voltage of said battery is less than the threshold value.

7. A voltage supply control method comprising:
    the step of determining whether a voltage of a battery is not less than a threshold value in a transmission mode, in which different threshold values are used for a plurality of transmission modes classified in accordance with assumed values of appropriate voltages to be supplied to a power amplification circuit to amplify a transmission signal;
    the step of causing a voltage conversion circuit to convert the voltage from the battery into a desired voltage and supplying the voltage to the power amplification circuit when a transmission power of the transmission signal is not less than the threshold value of the transmission power and the voltage of the battery is not less than the threshold value; and
    the step of supplying the voltage from the battery to the power amplification circuit without intervention of the voltage conversion circuit when the transmission power of the transmission signal is not less than the threshold value of the transmission power and the voltage of the battery is less than the threshold value.

\* \* \* \* \*